US012635140B2

(12) United States Patent
Gupta et al.

(10) Patent No.: US 12,635,140 B2
(45) Date of Patent: May 19, 2026

(54) ELECTRONIC DEVICES INCLUDING ISOLATION STRUCTURES EXHIBITING A WEAVE PATTERN, AND RELATED MEMORY DEVICES, SYSTEMS, AND METHODS

(71) Applicant: Micron Technology, Inc., Boise, ID (US)

(72) Inventors: Sidhartha Gupta, Boise, ID (US); Matthew J. King, Boise, ID (US); Jiewei Chen, Meridian, ID (US); Yi Hu, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 697 days.

(21) Appl. No.: 17/929,911

(22) Filed: Sep. 6, 2022

(65) Prior Publication Data

US 2024/0081076 A1     Mar. 7, 2024

(51) Int. Cl.
*H01L 21/66* (2006.01)
*H01L 21/02* (2006.01)
(Continued)

(52) U.S. Cl.
CPC ............. *H10B 43/50* (2023.02); *H10B 41/27* (2023.02); *H10B 41/50* (2023.02); *H10B 43/27* (2023.02)

(58) Field of Classification Search
CPC ........ H10B 41/27; H10B 41/50; H10B 43/27; H10D 62/115; H10D 62/116; H01L 21/76224; H01L 21/76286
See application file for complete search history.

(56) References Cited

U.S. PATENT DOCUMENTS 10,290,650 B1     5/2019   Iwai
10,475,804 B1     11/2019  Nishikawa et al.
(Continued)

FOREIGN PATENT DOCUMENTS

CN          107658306 A      2/2018

OTHER PUBLICATIONS

Gupta et al., Electronic Devices Including Tiered Stacks Including Conductive Structures Isolated by Slot Structures, and Related Systems and Methods, U.S. Appl. No. 17/453,041, filed Nov. 1, 2021, 68 pages.

(Continued)

*Primary Examiner* — John A Bodnar
(74) *Attorney, Agent, or Firm* — TraskBritt

(57) ABSTRACT

An electronic device comprises a stack comprising tiers of alternating conductive structures and insulative structures adjacent to a source, and strings of memory cells extending vertically through the stack. The strings of memory cells individually comprising a channel material extending vertically through the stack. The electronic device comprises an additional stack adjacent to the stack and comprising tiers of alternating additional conductive structures and additional insulative structures, pillars extending through the additional stack and adjacent to the strings of memory cells, conductive contacts adjacent to the pillars, and isolation structures laterally intervening between neighboring pillars. The isolation structures exhibit a weave pattern, and portions of the isolation structures are laterally adjacent to and physically contact the conductive contacts. Related memory devices, systems, and methods are also described.

26 Claims, 11 Drawing Sheets

(51) Int. Cl.

| | | |
|---|---|---|
| *H10B 41/27* | (2023.01) | |
| *H10B 41/50* | (2023.01) | |
| *H10B 43/27* | (2023.01) | |
| *H10B 43/50* | (2023.01) | |

(56) References Cited

U.S. PATENT DOCUMENTS

| | | | |
|---|---|---|---|
| 11,362,142 B2 | 6/2022 | Hu | |
| 2017/0263723 A1 | 9/2017 | Lee et al. | |
| 2021/0358806 A1 | 11/2021 | Hu et al. | |
| 2022/0068955 A1* | 3/2022 | King | H10B 43/10 |
| 2022/0157719 A1 | 5/2022 | Luo et al. | |
| 2022/0157725 A1 | 5/2022 | Gupta | |
| 2022/0199641 A1 | 6/2022 | Fukuzumi et al. | |
| 2022/0216094 A1 | 7/2022 | Clampitt et al. | |

OTHER PUBLICATIONS

Xu et al., Methods of Forming Microelectronic Devices, and Related Microelectronic Devices, Memory Devices, and Electronic Systems, U.S. Appl. No. 17/205,954, filed Mar. 18, 2021, 77 pages.

* cited by examiner

ELECTRONIC DEVICES INCLUDING ISOLATION STRUCTURES EXHIBITING A WEAVE PATTERN, AND RELATED MEMORY DEVICES, SYSTEMS, AND METHODS

TECHNICAL FIELD

Embodiments disclosed herein relate to the field of electronic device design and fabrication. More particularly, embodiments of the disclosure relate to electronic devices including isolation structures (e.g., filled slot structures) exhibiting a weave pattern, and related memory devices, systems, and methods of forming the electronic devices.

BACKGROUND

A continuing goal of the electronics industry has been to increase the memory density (e.g., the number of memory cells per memory die) of memory devices, such as non-volatile memory devices (e.g., NAND Flash memory devices). One way of increasing memory density in non-volatile memory devices is to utilize vertical memory array (also referred to as a "three-dimensional (3D) memory array") architectures. A conventional vertical memory array includes vertical memory strings extending through openings in one or more stack structures including tiers of conductive structures and insulative structures. Each vertical memory string may include at least one select device coupled in series to a serial combination of vertically-stacked memory cells. Such a configuration permits a greater number of switching devices (e.g., transistors) to be located in a unit of die area (i.e., length and width of active surface consumed) by building the array upwards (e.g., vertically) on a die, as compared to structures with conventional planar (e.g., two-dimensional) arrangements of transistors.

Vertical memory array architectures generally include electrical connections between the conductive structures of the tiers of the stack structure(s) of the memory device and access lines (e.g., word lines) so that the memory cells of the vertical memory array can be uniquely selected for writing, reading, or erasing operations. One method of forming such an electrical connection includes forming so-called "staircase" (or "stair step") structures at edges (e.g., horizontal ends) of the conductive structures of the stack structure(s) of the memory device. The staircase structure includes individual "steps" defining contact regions of the conductive structures, upon which conductive contact structures can be positioned to provide electrical access to the conductive structures.

As vertical memory array technology has advanced, additional memory density has been provided by forming vertical memory arrays to include stacks comprising additional tiers of conductive structures and, hence, additional staircase structures and/or additional steps in individual staircase structures associated therewith. As the number of tiers of the conductive structures increases, processing conditions of the formation of aligned contacts to various components of an electronic device become increasingly difficult. In addition, other technologies to increase memory density have reduced the spacing between adjacent vertical memory strings.

DETAILED DESCRIPTION

Figure 1A:
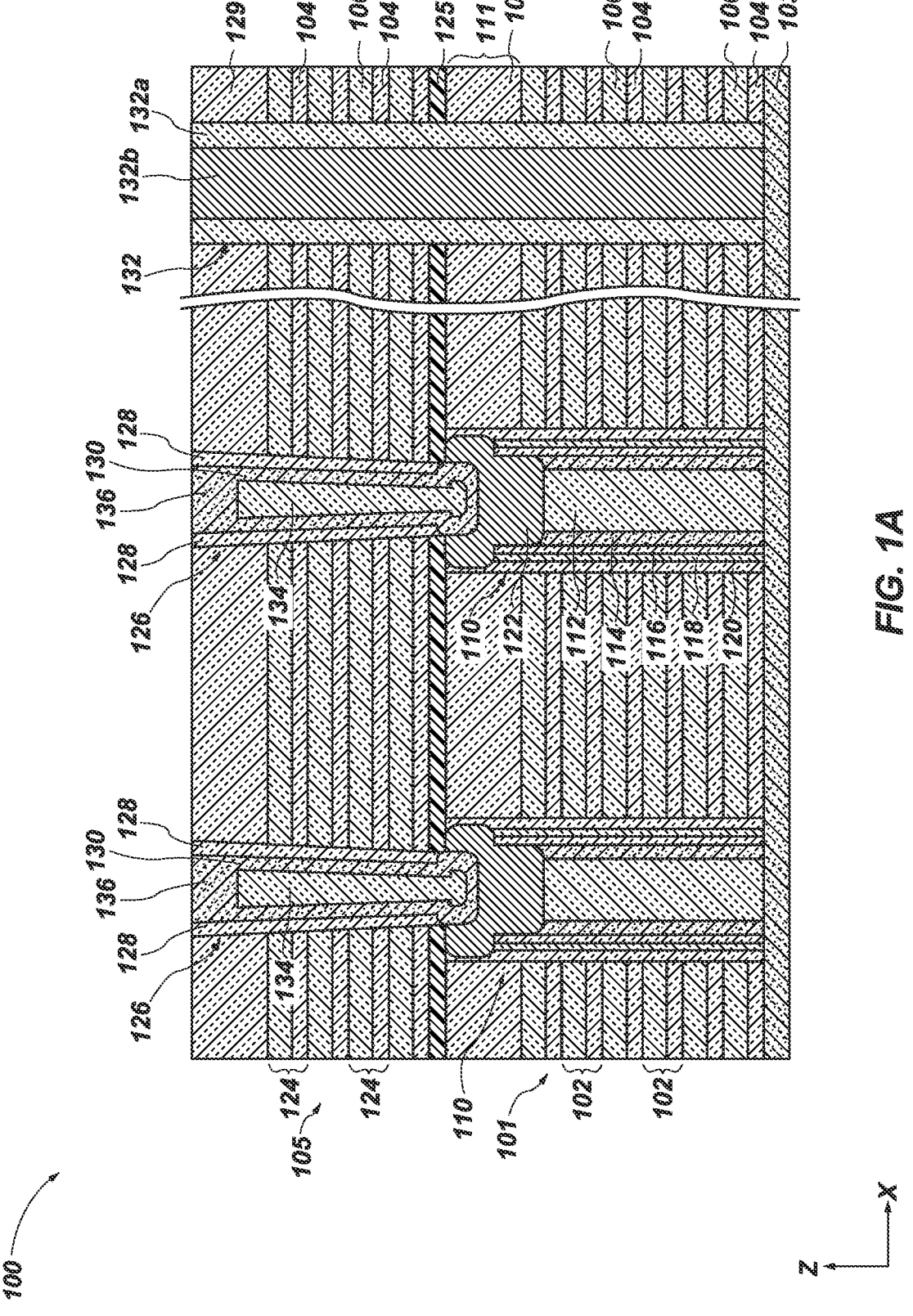
FIGS. 1A through 1H are simplified partial cross-sectional views (FIGS. 1A and 1C through 1G) and simplified partial top-down views (FIGS. 1B and 1H) illustrating a method of forming an electronic device, in accordance with embodiments of the disclosure, where the cross-sectional views of FIGS. 1A and 1G are taken along the A-A line, and the G-G line in FIGS. 1B and 1H, respectively.

An electronic device (e.g., an apparatus, a microelectronic device) that includes slots segmenting the electronic device into blocks, additional slots segmenting the blocks into sub-blocks, and pillars (e.g., upper pillars) adjacent to the additional slots is disclosed. Isolation structures within the additional slots and laterally intervening between neighboring pillars exhibit a weave pattern. The isolation structures may be self-aligned with conductive contacts adjacent to (e.g., overlying) the pillars. The electronic device comprises a stack comprising tiers of alternating conductive structures and insulative structures adjacent to a source, and strings of memory cells extending vertically through the stack. The strings of memory cells individually comprise a channel material extending vertically through the stack. The electronic device comprises an additional stack (e.g., an upper stack structure, a select gate drain (SGD) stack structure) adjacent to (e.g., overlying) the stack and comprising tiers of alternating additional conductive structures and additional insulative structures, and pillars (e.g., upper pillars, which may be characterized as device structures) extending through the additional stack and adjacent to the strings of memory cells. The electronic device comprises conductive contacts adjacent to the pillars, and isolation structures laterally intervening between neighboring pillars. The isolation structures exhibit a weave pattern, and portions of the isolation structures are laterally adjacent to and physically contact the conductive contacts.

During formation of the electronic device, the isolation structures within the additional slots may be formed following formation of the conductive contacts. The isolation structures may be formed by self-aligning the isolation structures with the conductive contacts. For example, lower portions of the isolation structures may be self-aligned with the pillars, and the upper portions of the isolation structures may be self-aligned with the conductive contacts. Since the conductive contacts are formed prior to formation of the additional slots, the additional slots are laterally adjacent to the conductive contacts. Reducing the spacing between adjacent strings of memory cells may increase a difficulty of forming various isolation structures between the strings of memory cells. By forming the conductive contacts prior to formation of the additional slots, the additional slots may be self-aligned with the conductive contacts, without conducting additional patterning and etching processes. For example, portions of the conductive contacts may protect (e.g., shield) the upper pillars from being removed (e.g., exhumed) during material removal processes of the materials of the additional stack. Uppermost portions of the isolation structures may, optionally, exhibit a substantially linear shape responsive to using a resist material comprising substantially linear openings during formation of the additional slots. Further, the weave pattern of the isolation structures may facilitate improved operation of the electronic device, without undesirably increasing the overall width (e.g., horizontal footprint) of the blocks.

The following description provides specific details, such as material compositions, shapes, and sizes, in order to provide a thorough description of embodiments of the disclosure. However, a person of ordinary skill in the art would understand that the embodiments of the disclosure may be practiced without employing these specific details. Indeed, the embodiments of the disclosure may be practiced in conjunction with conventional electronic device fabrication techniques employed in the industry. In addition, the description provided below does not form a complete process flow for manufacturing an electronic device (e.g., a memory device, such as 3D NAND Flash memory device). The structures described below do not form a complete electronic device. Only those process acts and structures necessary to understand the embodiments of the disclosure are described in detail below. Additional acts to form a complete electronic device from the structures may be performed by conventional fabrication techniques.

Unless otherwise indicated, the materials described herein may be formed by conventional techniques including, but not limited to, spin coating, blanket coating, chemical vapor deposition (CVD), atomic layer deposition (ALD), plasma enhanced ALD, physical vapor deposition (PVD) (including sputtering, evaporation, ionized PVD, and/or plasma-enhanced CVD), or epitaxial growth. Alternatively, the materials may be grown in situ. Depending on the specific material to be formed, the technique for depositing or growing the material may be selected by a person of ordinary skill in the art. The removal of materials may be accomplished by any suitable technique including, but not limited to, etching (e.g., dry etching, wet etching, vapor etching), ion milling, abrasive planarization (e.g., chemical-mechanical planarization), or other known methods unless the context indicates otherwise.

Drawings presented herein are for illustrative purposes only, and are not meant to be actual views of any particular material, component, structure, electronic device, or electronic system. Variations from the shapes depicted in the drawings as a result, for example, of manufacturing techniques and/or tolerances, are to be expected. Thus, embodiments described herein are not to be construed as being limited to the particular shapes or regions as illustrated, but include deviations in shapes that result, for example, from manufacturing. For example, a region illustrated or described as box-shaped may have rough and/or nonlinear features, and a region illustrated or described as round may include some rough and/or linear features. Moreover, sharp angles that are illustrated may be rounded, and vice versa. Thus, the regions illustrated in the figures are schematic in nature, and their shapes are not intended to illustrate the precise shape of a region and do not limit the scope of the present claims. The drawings are not necessarily to scale. Additionally, elements common between figures may retain the same numerical designation.

As used herein, the singular forms "a," "an," and "the" are intended to include the plural forms as well, unless the context clearly indicates otherwise.

As used herein, "and/or" includes any and all combinations of one or more of the associated listed items.

As used herein, spatially relative terms, such as "beneath," "below," "lower," "bottom," "above," "upper," "top," "front," "rear," "left," "right," and the like, may be used for ease of description to describe one element's or feature's relationship to another element(s) or feature(s) as illustrated in the figures. Unless otherwise specified, the spatially relative terms are intended to encompass different orientations of the materials in addition to the orientation depicted in the figures. For example, if materials in the figures are inverted, elements described as "below" or "beneath" or "under" or "on bottom of" other elements or features would then be oriented "above" or "on top of" the other elements or features. Thus, the term "below" can encompass both an orientation of above and below, depending on the context in which the term is used, which will be evident to one of ordinary skill in the art. The materials may be otherwise oriented (e.g., rotated 90 degrees, inverted, flipped) and the spatially relative descriptors used herein interpreted accordingly.

As used herein, the terms "vertical," "longitudinal," "horizontal," and "lateral" are in reference to a major plane of a structure and are not necessarily defined by Earth's gravitational field. A "horizontal" or "lateral" direction is a direction that is substantially parallel to the major plane of the structure, while a "vertical" or "longitudinal" direction is a direction that is substantially perpendicular to the major plane of the structure. The major plane of the structure is defined by a surface of the structure having a relatively large area compared to other surfaces of the structure.

As used herein, reference to an element as being "on" or "over" another element means and includes the element being directly on top of, directly adjacent to (e.g., directly laterally adjacent to, directly vertically adjacent to), directly underneath, or in direct contact with the other element. It also includes the element being indirectly on top of, indirectly adjacent to (e.g., indirectly laterally adjacent to, indirectly vertically adjacent to), indirectly underneath, or near the other element, with other elements present therebetween. In contrast, when an element is referred to as being "directly on" or "directly adjacent to" another element, there are no intervening elements present.

As used herein, the term "configured" refers to a size, shape, material composition, and arrangement of one or more of at least one structure and at least one apparatus facilitating operation of one or more of the structure and the apparatus in a pre-determined way.

As used herein, features (e.g., regions, materials, structures, devices) described as "neighboring" one another means and includes features of the disclosed identity (or identities) that are located most proximate (e.g., closest to) one another. Additional features (e.g., additional regions, additional materials, additional structures, additional devices) not matching the disclosed identity (or identities) of the "neighboring" features may be disposed between the "neighboring" features. Stated another way, the "neighboring" features may be positioned directly adjacent one another, such that no other feature intervenes between the "neighboring" features; or the "neighboring" features may be positioned indirectly adjacent one another, such that at least one feature having an identity other than that associated with at least one the "neighboring" features is positioned between the "neighboring" features. Accordingly, features described as "vertically neighboring" one another means and includes features of the disclosed identity (or identities) that are located most vertically proximate (e.g., vertically closest to) one another. Moreover, features described as "horizontally neighboring" one another means and includes features of the disclosed identity (or identities) that are located most horizontally proximate (e.g., horizontally closest to) one another.

As used herein, the term "substantially" in reference to a given parameter, property, or condition means and includes to a degree that one of ordinary skill in the art would understand that the given parameter, property, or condition is met with a degree of variance, such as within acceptable tolerances. By way of example, depending on the particular parameter, property, or condition that is substantially met, the parameter, property, or condition may be at least 90.0 percent met, at least 95.0 percent met, at least 99.0 percent met, at least 99.9 percent met, or even 100.0 percent met.

As used herein, "about" or "approximately" in reference to a numerical value for a particular parameter is inclusive of the numerical value and a degree of variance from the numerical value that one of ordinary skill in the art would understand is within acceptable tolerances for the particular parameter. For example, "about" or "approximately" in reference to a numerical value may include additional numerical values within a range of from 90.0 percent to 108.0 percent of the numerical value, such as within a range of from 95.0 percent to 105.0 percent of the numerical value, within a range of from 97.5 percent to 102.5 percent of the numerical value, within a range of from 99.0 percent to 101.0 percent of the numerical value, within a range of from 99.5 percent to 100.5 percent of the numerical value, or within a range of from 99.9 percent to 100.1 percent of the numerical value.

As used herein, the term "memory device" means and includes microelectronic devices exhibiting memory functionality, but not necessarily limited to memory functionality. Stated another way, and by way of example only, the term "memory device" means and includes not only memory (e.g., volatile memory, such as dynamic random access memory (DRAM); non-volatile memory, such as NAND memory), but also includes an application specific integrated circuit (ASIC) (e.g., a system on a chip (SoC)), an electronic device combining logic and memory, or a graphics processing unit (GPU) incorporating memory.

As used herein, the term "electronic device" includes, without limitation, a memory device, as well as a semiconductor device which may or may not incorporate memory, such as a logic device, a processor device, or a radiofrequency (RF) device. Further, an electronic device may incorporate memory in addition to other functions such as, for example, a so-called "system on a chip" (SoC) including a processor and memory, or an electronic device including logic and memory. The electronic device may, for example, be a 3D electronic device, such as a 3D NAND Flash memory device.

As used herein, the term "conductive material" means and includes an electrically conductive material. The conductive material may include one or more of a doped polysilicon, undoped polysilicon, a metal, an alloy, a conductive metal oxide, a conductive metal nitride, a conductive metal silicide, and a conductively doped semiconductor material. By way of example only, the conductive material may be one or more of tungsten (W), tungsten nitride ($WN_y$), nickel (Ni), tantalum (Ta), tantalum nitride ($TaN_y$), tantalum silicide ($TaSi_x$), platinum (Pt), copper (Cu), silver (Ag), gold (Au), aluminum (Al), molybdenum (Mo), titanium (Ti), titanium nitride ($TiN_y$), titanium silicide ($TiSi_x$), titanium silicon nitride ($TiSi_xN_y$), titanium aluminum nitride ($TiAl_xN_y$), molybdenum nitride ($MoN_x$), iridium (Ir), iridium oxide ($IrO_z$), ruthenium (Ru), ruthenium oxide ($RuO_z$), n-doped polysilicon, p-doped polysilicon, undoped polysilicon, and conductively doped silicon.

As used herein, a "conductive structure" means and includes a structure formed of and including one or more conductive materials.

As used herein, "insulative material" means and includes an electrically insulative material, such one or more of at least one dielectric oxide material (e.g., one or more of a silicon oxide ($SiO_x$), phosphosilicate glass, borosilicate glass, borophosphosilicate glass, fluorosilicate glass, an aluminum oxide ($AlO_x$), a hafnium oxide ($HfO_x$), a niobium oxide ($NbO_x$), a titanium oxide ($TiO_x$), a zirconium oxide ($ZrO_x$), a tantalum oxide ($TaO_x$), and a magnesium oxide (MgO)), at least one dielectric nitride material (e.g., a silicon nitride ($SiN_y$)), at least one dielectric oxynitride material (e.g., a silicon oxynitride ($SiO_xN_y$)), and at least one dielectric carboxynitride material (e.g., a silicon carboxynitride ($SiO_xC_zN_y$)). Formulae including one or more of "x," "y," and "z" herein (e.g., $SiO_x$, $AlO_x$, $HfO_x$, $NbO_x$, $TiO_x$, $SiN_y$, $SiO_xN_y$, $SiO_xC_zN_y$) represent a material that contains an average ratio of "x" atoms of one element, "y" atoms of another element, and "z" atoms of an additional element (if any) for every one atom of another element (e.g., Si, Al, Hf, Nb, Ti). As the formulae are representative of relative atomic ratios and not strict chemical structure, an insulative material may comprise one or more stoichiometric compounds and/or one or more non-stoichiometric compounds, and values of "x," "y," and "z" (if any) may be integers or may be non-integers. As used herein, the term "non-stoichiometric compound" means and includes a chemical compound with an elemental composition that cannot be represented by a ratio of well-defined natural numbers and is in violation of the law of definite proportions.

As used herein, an "insulative structure" means and includes a structure formed of and including an insulative material.

As used herein, the term "dielectric material" means and includes an electrically insulative material. The dielectric material may include, but is not limited to, one or more of an insulative oxide material or an insulative nitride material. The insulative oxide may be a silicon oxide material, a metal oxide material, or a combination thereof. The insulative oxide may include, but is not limited to, a silicon oxide ($SiO_x$, silicon dioxide ($SiO_2$)), phosphosilicate glass, borosilicate glass, borophosphosilicate glass, fluorosilicate glass, aluminum oxide ($AlO_x$), gadolinium oxide ($GdO_x$), hafnium oxide ($HfO_x$), magnesium oxide ($MgO_x$), niobium oxide ($NbO_x$), tantalum oxide ($TaO_x$), titanium oxide ($TiO_x$), zirconium oxide ($ZrO_x$), hafnium silicate, a dielectric oxynitride material (e.g., $SiO_xN_y$), a dielectric carboxynitride material (e.g., $SiO_xC_zN_y$), a combination thereof, or a combination of one or more of the listed materials with silicon oxide. The insulative nitride material may include, but is not limited to, silicon nitride.

As used herein, the term "homogeneous" means relative amounts of elements included in a feature (e.g., a material, a structure) do not vary throughout different portions (e.g., different horizontal portions, different vertical portions) of the feature. Conversely, as used herein, the term "heterogeneous" means relative amounts of elements included in a feature (e.g., a material, a structure) vary throughout different portions of the feature. If a feature is heterogeneous, amounts of one or more elements included in the feature may vary stepwise (e.g., change abruptly), or may vary continuously (e.g., change progressively, such as linearly, parabolically) throughout different portions of the feature. The feature may, for example, be formed of and include a stack of at least two different materials.

As used herein, the term "selectively etchable" means and includes a material that exhibits a greater etch rate responsive to exposure to a given etch chemistry and/or process conditions relative to another material exposed to the same etch chemistry and/or process conditions. For example, the material may exhibit an etch rate that is at least about five times greater than the etch rate of another material, such as an etch rate of about ten times greater, about twenty times greater, or about forty times greater than the etch rate of the another material. Etch chemistries and etch conditions for selectively etching a desired material may be selected by a person of ordinary skill in the art.

Figure 1B:
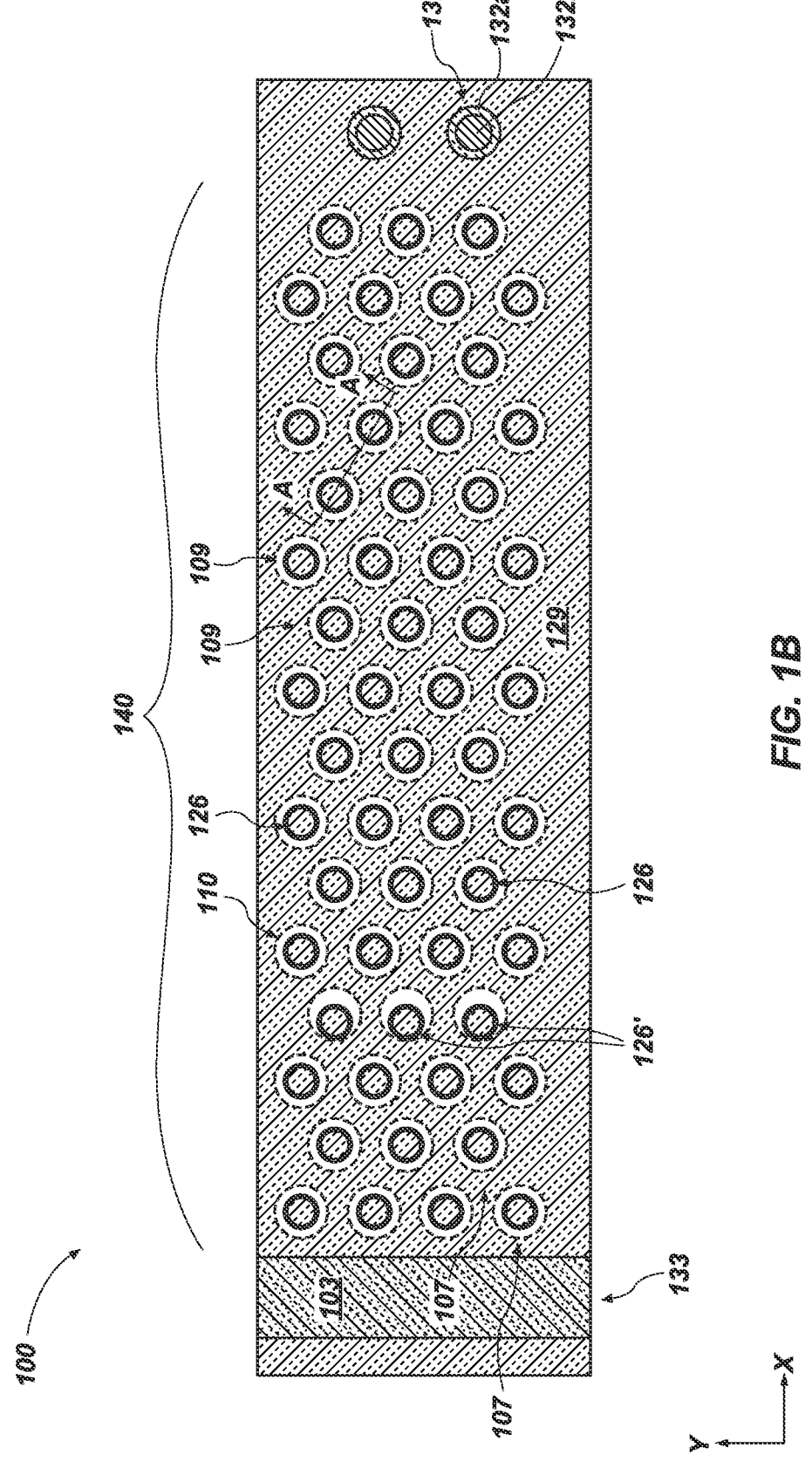
Figure 1C:
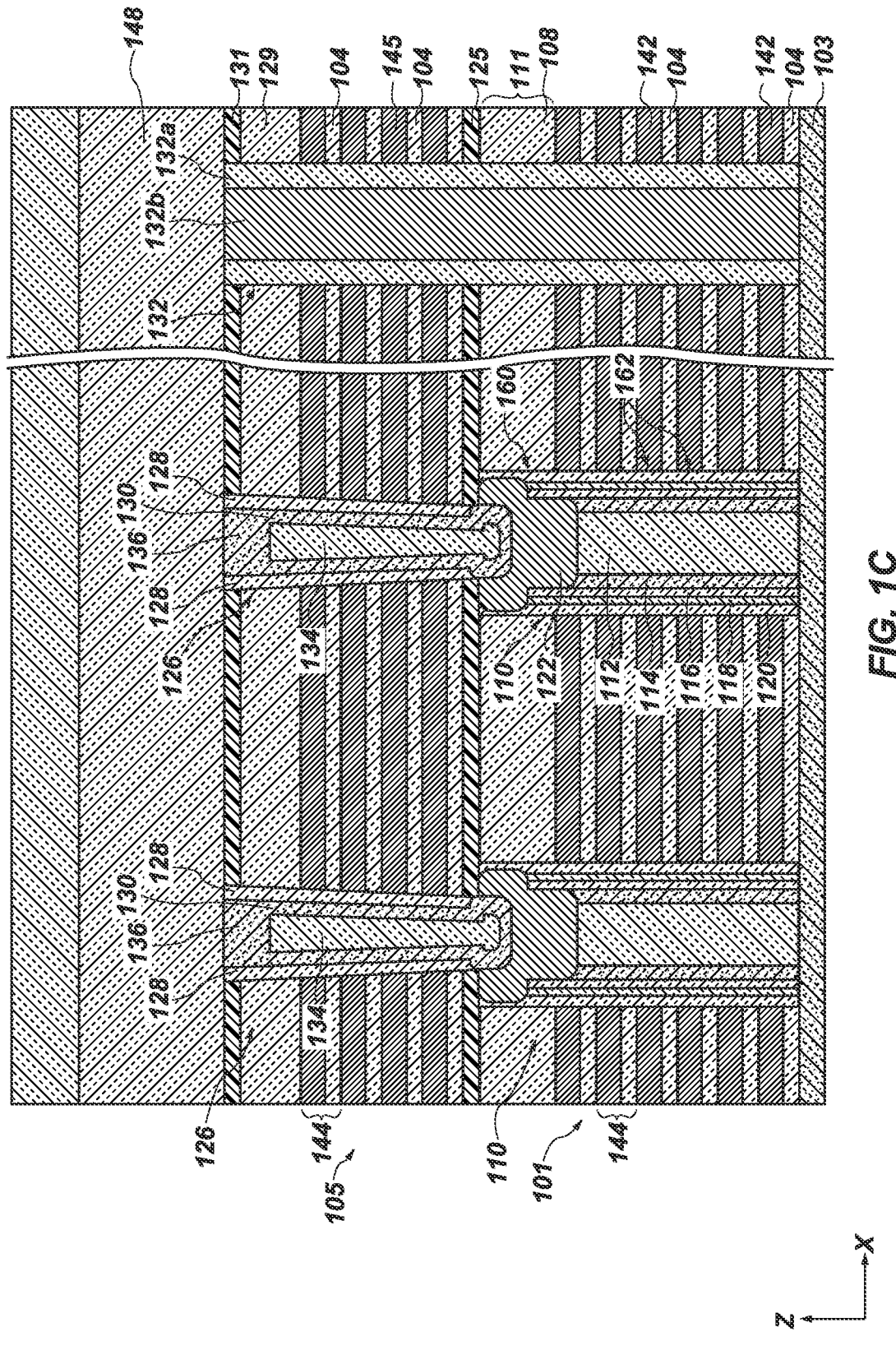
Figure 1D:
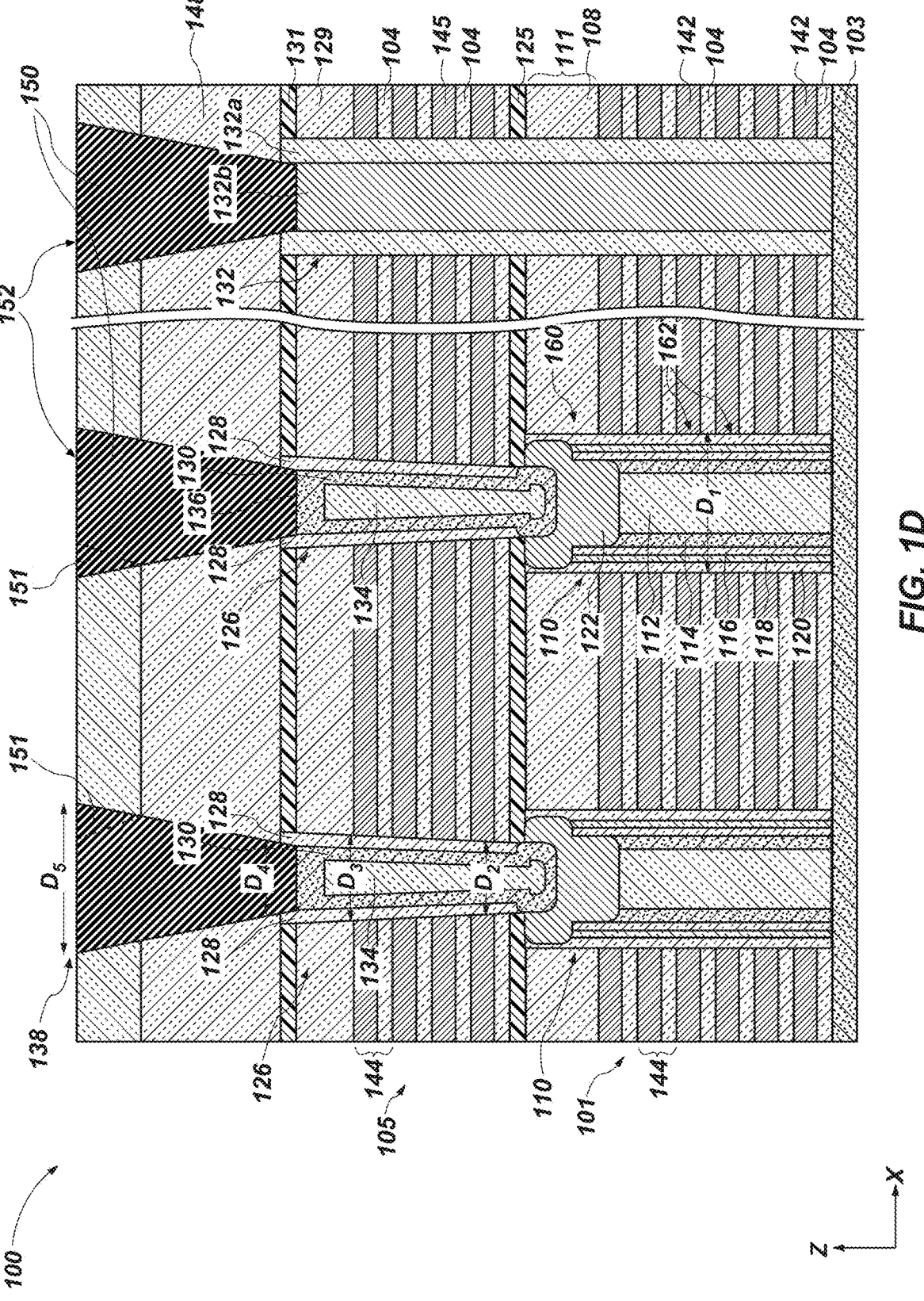
Figure 1E:
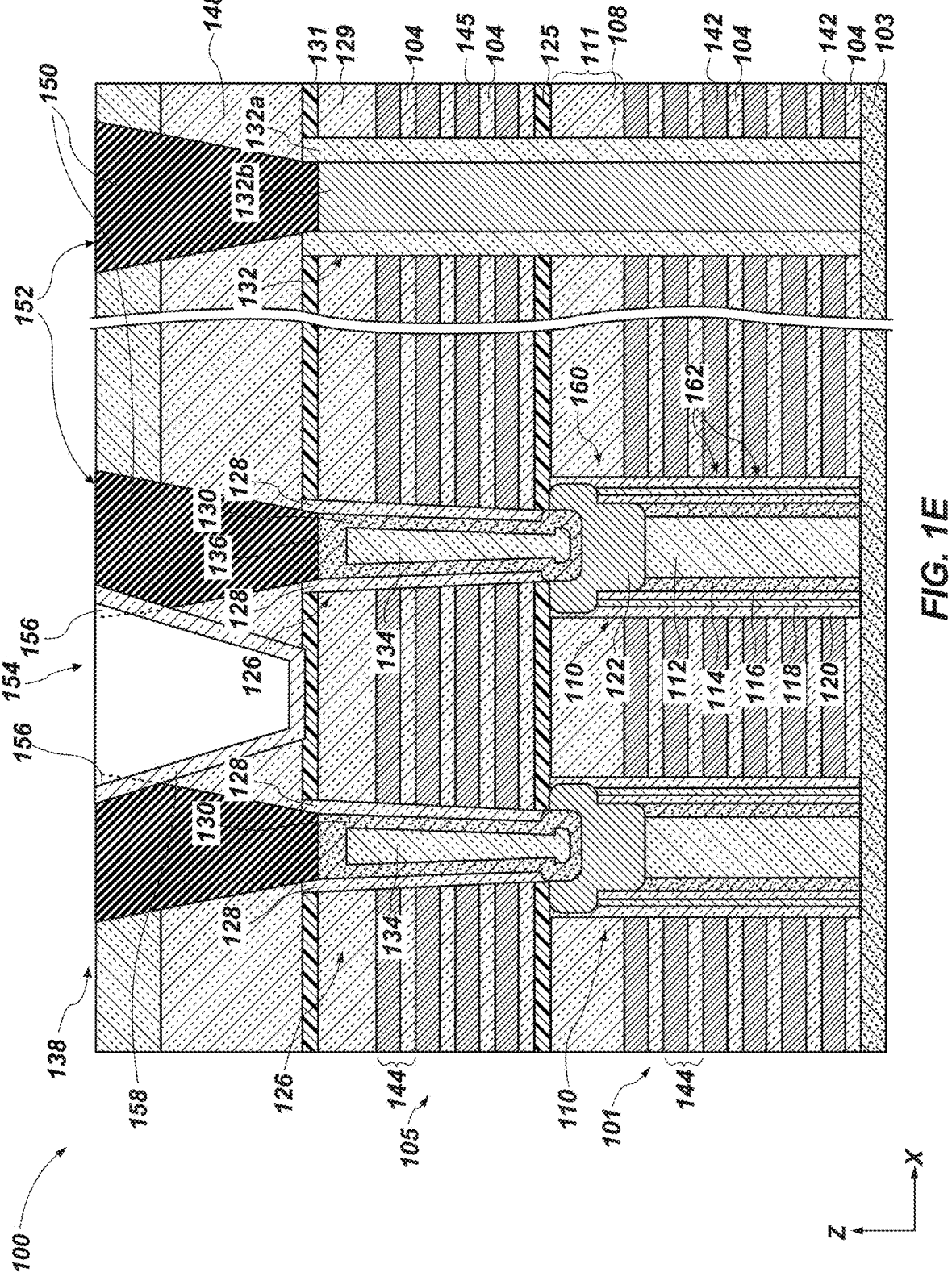
Figure 1F:
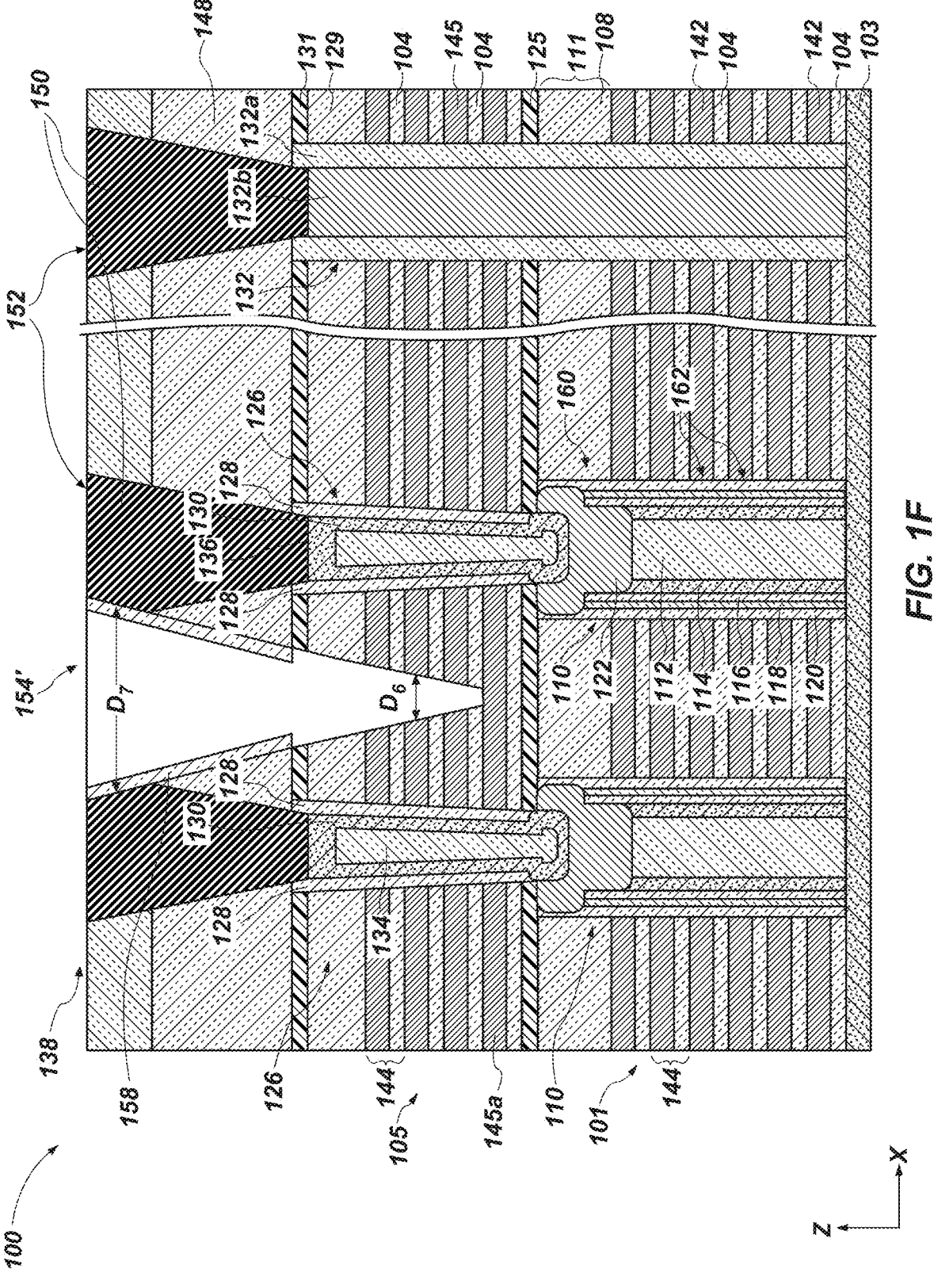
Figure 1G:
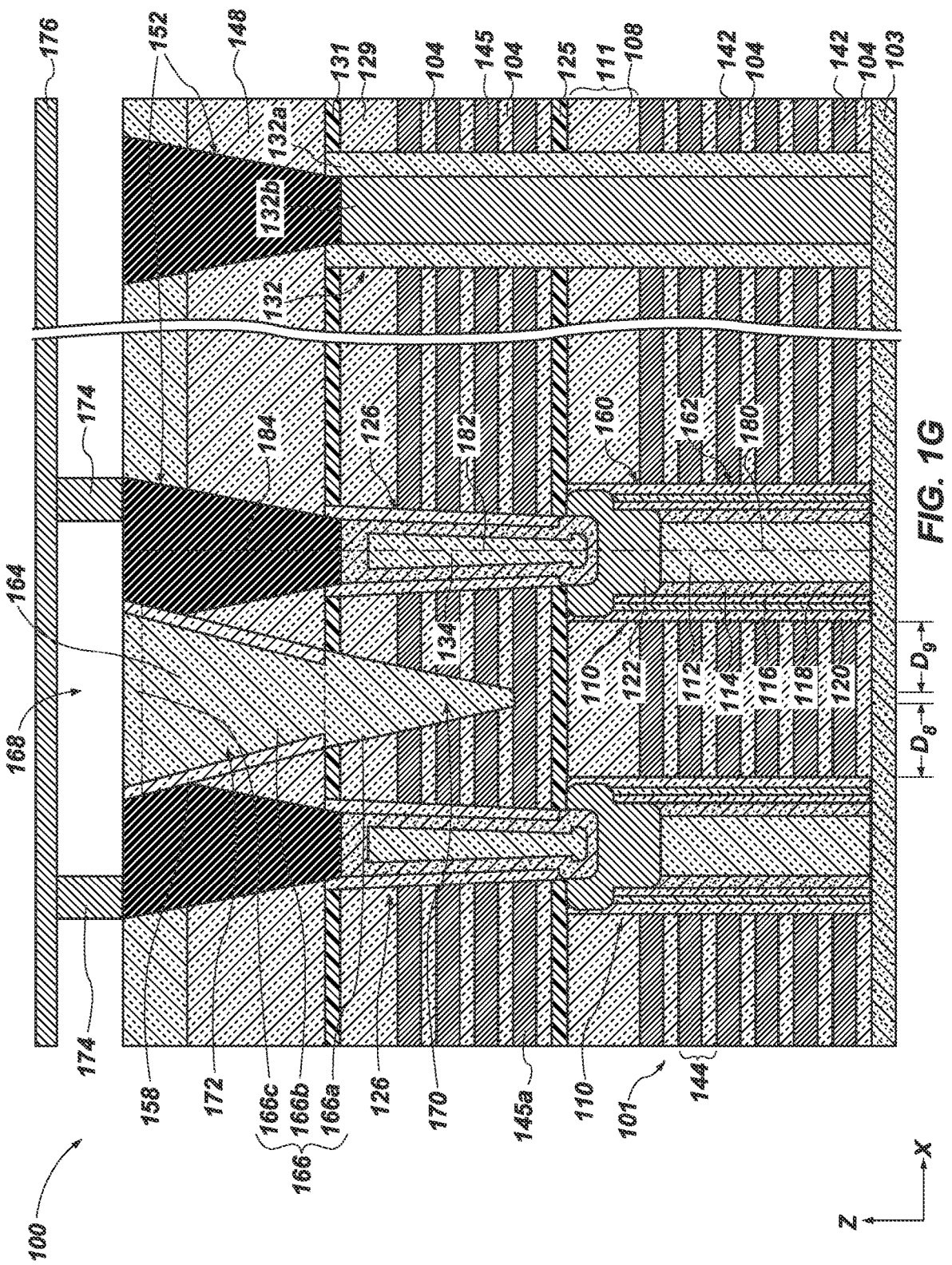
Figure 1H:
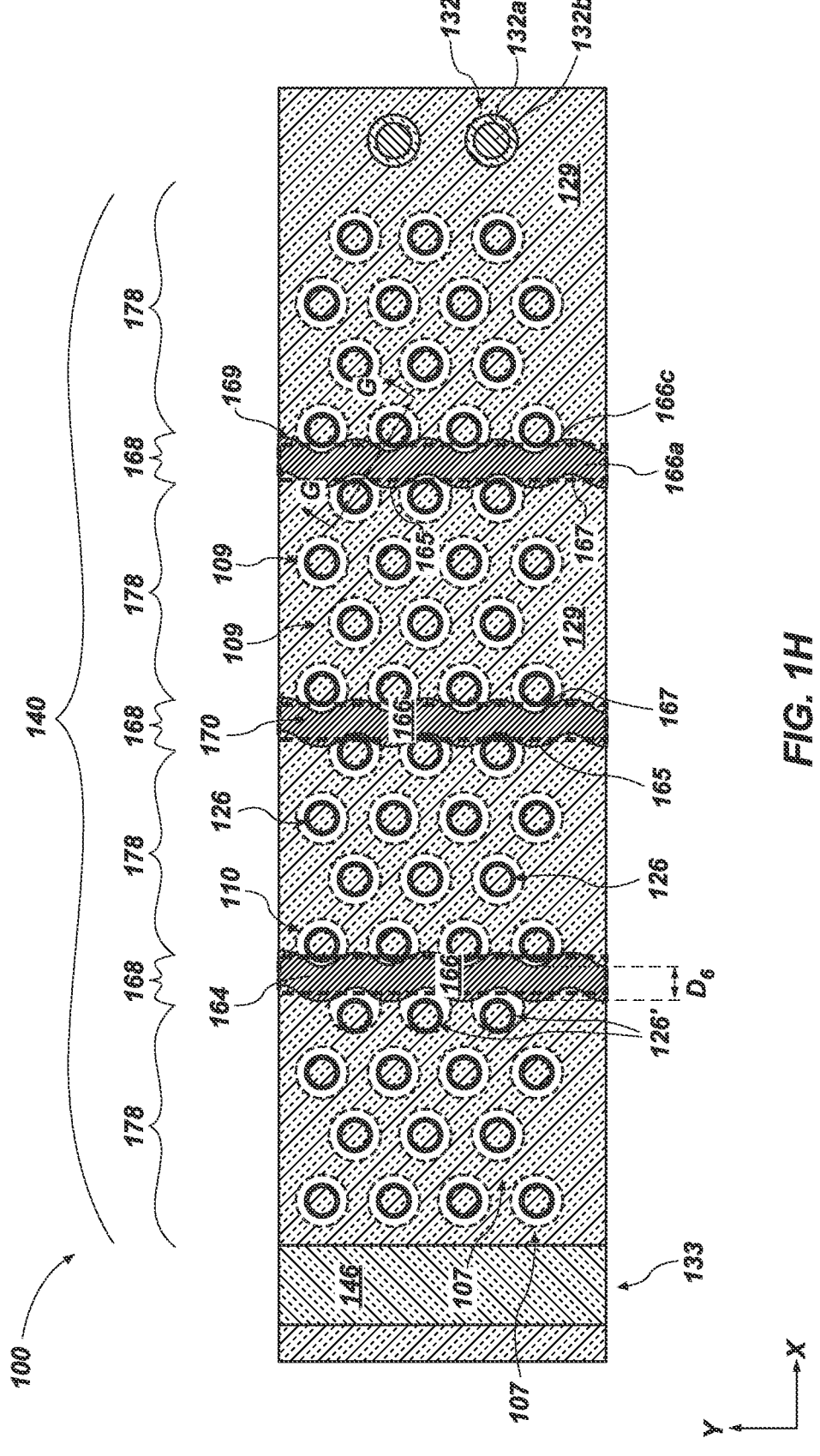
Figure 2:
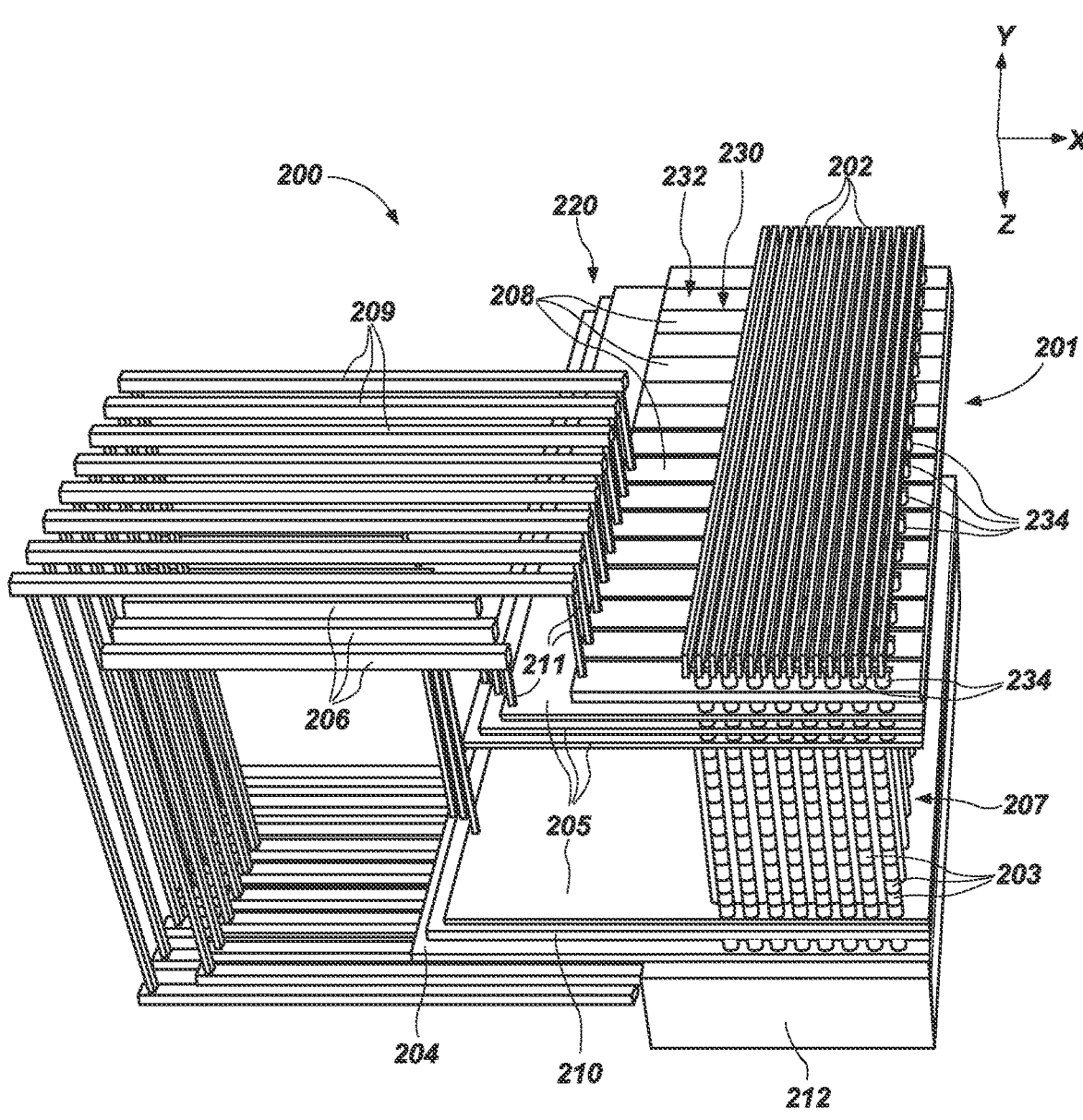
FIG. 2 is a partial cutaway perspective view of an electronic device, in accordance with embodiments of the disclosure.

FIGS. 1A through 1H illustrate a method of forming an electronic device (e.g., a memory device, such as a 3D NAND Flash memory device), in accordance with embodiments of the disclosure, of which FIGS. 1A and 1C through 1G are simplified partial cross-sectional views, and FIGS. 1B and 1H are simplified partial top-down views. The cross-sectional views of FIGS. 1A and 1G are taken along the A-A line, and the G-G line in FIGS. 1B and 1H, respectively. For convenience in describing FIGS. 1A through 1H, a first horizontal direction may be defined as the X-direction and a second horizontal direction, which is transverse (e.g., perpendicular) to the first horizontal direction, as the Y-direction. A third direction, which is transverse (e.g., perpendicular) to each of the first horizontal direction and the second horizontal direction, may be defined as the Z-direction. Similar directions are defined, as shown in FIG. 2, as described in greater detail below.

Referring to FIG. 1A, an electronic device 100 may be formed to include a stack 101 (e.g., a lower stack structure) including a vertically (e.g., in the Z-direction) alternating sequence of insulative structures 104 and other insulative structures 106 arranged in tiers 102. Each of the tiers 102 may individually include an insulative structure 104 directly vertically neighboring (e.g., adjacent) the other insulative structures 106. The insulative structures 104 of the stack 101 may also be referred to herein as "insulative materials" and the other insulative structures 106 of the stack 101 may also be referred to herein as "additional insulative materials."

In some embodiments, a number (e.g., quantity) of tiers 102 of the stack 101 may be within a range from 32 of the tiers 102 to 256 of the tiers 102. In some embodiments, the stack 101 includes 128 of the tiers 102. However, the disclosure is not so limited, and the stack 101 may include a different number of the tiers 102. In addition, in some embodiments, the stack 101 includes a deck structure vertically overlying a source 103 (e.g., a source tier, a source plate) and including the tiers 102 of the insulative structures 104 and the other insulative structures 106.

The insulative structures 104 may be formed of and include, for example, at least one dielectric material, such as one or more of an oxide material (e.g., silicon dioxide (SiO₂)), phosphosilicate glass, borosilicate glass, borophosphosilicate glass, fluorosilicate glass, titanium dioxide (TiO₂), hafnium oxide (HfO₂), zirconium dioxide (ZrO₂), hafnium dioxide (HfO₂), tantalum oxide (TaO₂), magnesium oxide (MgO), and aluminum oxide (Al₂O₃). In some embodiments, the insulative structures 104 are formed of and include silicon dioxide.

The other insulative structures 106 may be formed of and include an insulative material that is different than, and exhibits an etch selectivity with respect to, the insulative structures 104. In some embodiments, the other insulative structures 106 are formed of and include a nitride material (e.g., silicon nitride (Si₃N₄)) or an oxynitride material (e.g., silicon oxynitride). In some embodiments, the other insulative structures 106 comprise silicon nitride.

The source 103 may be formed of and include, for example, a semiconductor material doped with one or more p-type conductivity materials (e.g., polysilicon doped with at least one p-type dopant, such as one or more of boron, aluminum, and gallium) or one or more n-type conductivity materials (e.g., polysilicon doped with at least one n-type dopant, such as one or more of arsenic, phosphorous, antimony, and bismuth). The stack 101 may be referred to herein as a deck structure or a first deck structure. Although FIG. 1A has been described and illustrated as including the stack 101 directly over (e.g., on) the source 103, the disclosure is not so limited. In other embodiments, the stack 101 overlies a deck structure comprising additional tiers 102 of the insulative structures 104 and the other insulative structures 106 separated from the stack 101 by at least one dielectric material.

A dielectric material 108 may be located over an uppermost one of the tiers 102. The dielectric material 108 may be formed of and include an electrically insulative material, such as, for example, one or more of phosphosilicate glass (PSG), borosilicate glass (BSG), fluorosilicate glass (FSG), borophosphosilicate glass (BPSG), and silicon dioxide. In some embodiments, the dielectric material 108 comprises the same material composition as the insulative structures 104. In some embodiments, the dielectric material 108 comprises silicon dioxide.

Pillars 110 (e.g., cell pillars, memory pillars) of materials may vertically extend (e.g., in the Z-direction) through the stack 101. The materials of the pillars 110 may form memory cells (e.g., strings of memory cells). The materials of the pillars 110 may be formed by conventional techniques. The pillars 110 may each individually comprise an insulative material 112, a channel material 114 horizontally neighboring the insulative material 112, a tunnel dielectric material 116 (also referred to as a "tunneling dielectric material") horizontally neighboring the channel material 114, a memory material 118 horizontally neighboring the tunnel dielectric material 116, and a dielectric blocking material 120 (also referred to as a "charge blocking material") horizontally neighboring the memory material 118. The dielectric blocking material 120 may be horizontally neighboring one of the other insulative structures 106 of one of the tiers 102 of the stack 101. The channel material 114 may be horizontally interposed between the insulative material 112 and the tunnel dielectric material 116, the tunnel dielectric material 116 may be horizontally interposed between the channel material 114 and the memory material 118, the memory material 118 may be horizontally interposed between the tunnel dielectric material 116 and the dielectric blocking material 120, and the dielectric blocking material 120 may be horizontally interposed between the memory material 118 and the other insulative structure 106.

The insulative material 112 may be formed of and include an electrically insulative material such as, for example, phosphosilicate glass (PSG), borosilicate glass (BSG), fluorosilicate glass (FSG), borophosphosilicate glass (BPSG), silicon dioxide, titanium dioxide, zirconium dioxide, hafnium dioxide, tantalum oxide, magnesium oxide, aluminum oxide, niobium oxide, molybdenum oxide, strontium oxide, barium oxide, yttrium oxide, a nitride material, (e.g., silicon nitride (Si₃N₄)), an oxynitride (e.g., silicon oxynitride), a dielectric carbon nitride material (e.g., silicon carbon nitride (SiCN)), a dielectric carboxynitride material (e.g., silicon carboxynitride (SiOCN)), or combinations thereof. In some embodiments, the insulative material 112 comprises silicon dioxide.

The channel material 114 may be formed of and include one or more of a semiconductor material (at least one elemental semiconductor material, such as polycrystalline silicon; at least one III-V compound semiconductor material, at least one II-VI compound semiconductor material, at least one organic semiconductor material, GaAs, InP, GaP, GaN, other semiconductor materials), and an oxide semiconductor material. In some embodiments, the channel material 114 includes amorphous silicon or polysilicon. In some embodiments, the channel material 114 comprises a doped semiconductor material.

The tunnel dielectric material 116 may be formed of and include a dielectric material through which charge tunneling can be performed under suitable electrical bias conditions, such as through hot-carrier injection or by Fowler-Nordheim tunneling induced charge transfer. By way of non-limiting example, the tunnel dielectric material 116 may be formed of and include one or more of silicon oxide, silicon nitride, silicon oxynitride, dielectric metal oxides (such as aluminum oxide and hafnium oxide), dielectric metal oxynitride, dielectric metal silicates, alloys thereof, and/or combinations thereof. In some embodiments, the tunnel dielectric material 116 comprises silicon dioxide. In other embodiments, the tunnel dielectric material 116 comprises silicon oxynitride.

The memory material 118 may comprise a charge trapping material or a conductive material. The memory material 118 may be formed of and include one or more of silicon nitride, silicon oxynitride, polysilicon (doped polysilicon), a conductive material (tungsten, molybdenum, tantalum, titanium, platinum, ruthenium, and alloys thereof, or a metal silicide such as tungsten silicide, molybdenum silicide, tantalum silicide, titanium silicide, nickel silicide, cobalt silicide, or a combination thereof), a semiconductive material polycrystalline or amorphous semiconductor material including at least one elemental semiconductor element or at least one compound semiconductor material, conductive nanoparticles (e.g., ruthenium nanoparticles), metal dots. In some embodiments, the memory material 118 comprises silicon nitride.

The dielectric blocking material 120 may be formed of and include a dielectric material such as, for example, one or more of an oxide (e.g., silicon dioxide), a nitride (silicon nitride), and an oxynitride (silicon oxynitride), or another material. In some embodiments, the dielectric blocking material 120 comprises silicon oxynitride.

In some embodiments the tunnel dielectric material 116, the memory material 118, and the dielectric blocking material 120 together may comprise a structure configured to trap a charge, such as, for example, an oxide-nitride-oxide (ONO) structure. In some such embodiments, the tunnel dielectric material 116 comprises silicon dioxide, the memory material 118 comprises silicon nitride, and the dielectric blocking material 120 comprises silicon dioxide.

After forming the pillars 110, a portion of the pillars 110 may be removed to recess the pillars 110 relative to an uppermost surface of the dielectric material 108. In some embodiments, a portion of the insulative material 112 and the channel material 114 may be recessed vertically lower (e.g., in the Z-direction) than the other components of the pillars 110 (e.g., the tunnel dielectric material 116, the memory material 118, the dielectric blocking material 120). In some embodiments, a conductive material 122 may be formed within the recesses to form a so-called "conductive plug structure." The conductive material 122 may be formed of and include, a polysilicon or another material formulated to exhibit an etch selectivity with respect to the material of the dielectric material 108 and, in some embodiments, with respect to one or more of the materials of the pillar 110. In some embodiments, the conductive material 122 is electrically connected to (e.g., in electrical communication with)

the channel material 114. In some embodiments, the conductive material 122 comprises doped polysilicon. In some embodiments, the conductive material 122 is doped with one or more n-type dopants such as, for example, phosphorus. In some embodiments, the conductive material 122 is lightly doped (e.g., at a concentration of about $1 \times 10^{18}$ atoms/cm$^3$). The conductive material 122 may comprise sharp corners or, alternatively, the conductive material 122 may comprise rounded corners, as shown in FIG. 1A. After forming the conductive material 122, the electronic device 100 may be exposed to, for example, a chemical mechanical planarization (CMP) process to remove conductive material from outside surfaces of the recesses (e.g., on an upper surface of the dielectric material 108).

With continued reference to FIG. 1A, after forming the conductive material 122, an additional stack 105 (e.g., an upper stack structure, a select gate drain (SGD) stack structure) may be formed over the stack 101. The stack 101 may also be referred to herein as an additional deck structure or a second deck structure. The additional stack 105 may include a vertically alternating sequence of additional insulative structures 104 and additional other insulative structures 106 formed over an optional etch stop material 125. The additional insulative structures 104 and the additional other insulative structures 106 may be arranged in tiers 124. The dielectric material 108 between the stack 101 and the additional stack 105 may be referred to as an interdeck region 111. The additional stack 105 may include an uppermost insulative structure 129 having a greater thickness in a vertical direction (e.g., in the Z-direction) than other insulative structures 104 of the additional stack 105.

The etch stop material 125, if present, may be formed of and include, for example, a material exhibiting an etch selectivity with respect to the insulative structures 104 and the other insulative structures 106. In some embodiments, the etch stop material 125 comprises a carbon-containing material (e.g., silicon carbon nitride (SiCN)). In some such embodiments, the etch stop material 125 may facilitate an improved electric field through a channel region proximate the etch stop material 125 during use and operation of the electronic device 100. In some embodiments, the electronic device 100 may not include the etch stop material 125 between the stack 101 and the additional stack 105. In some such embodiments, the dielectric material 108 (e.g., alone) may intervene between the stack 101 and the additional stack 105.

As shown in FIG. 1A, upper pillars 126 may vertically extend (e.g., in the Z-direction) through the additional stack 105. At least some (e.g., each) of the upper pillars 126 are substantially horizontally aligned (e.g., are concentric) with the pillars 110, as described in greater detail with reference to FIG. 1G. For example, a central axis of each of the upper pillars 126 may be substantially horizontally aligned (e.g., in each of the X-direction and the Y-direction) relative to a central axis of the vertically underlying pillars 110. The upper pillars 126 may extend into the conductive material 122 and horizontal boundaries (e.g., lateral edges) of the upper pillars 126 may not extend beyond horizontal boundaries (e.g., lateral edges) of the pillars 110. As described below, some of the upper pillars 126 may neighbor (e.g., be located adjacent to) slots separating blocks of the electronic device 100 into one or more sub-blocks.

The upper pillars 126 may each individually include a liner material 128, a channel material 130 horizontally neighboring the liner material 128, and an insulative material 134 horizontally neighboring the channel material 130. The liner material 128 may be horizontally neighboring the additional other insulative structures 106 of the tiers 124 of the additional stack 105. The channel material 130 may be horizontally interposed between the liner material 128 and the insulative material 134. The insulative material 134 may also vertically overlie (e.g., in the Z-direction) the channel material 130, such as a horizontally extending portion of the channel material 130 over the conductive material 122.

The liner material 128 may be formed of and include, for example, an insulative material, such as one or more of the materials described above with reference to the insulative material 112. In some embodiments, the liner material 128 comprises silicon dioxide. The channel material 130 may be in electrical communication with the channel material 114 through the conductive material 122. The channel material 130 may comprise one or more of the materials described above with reference to the channel material 114. In some embodiments, the channel material 130 comprises the same material composition as the channel material 114. In some embodiments, the channel material 130 may be continuous with the channel material 114. Since the channel material 130 may comprise the same material composition as the channel material 114 and the channel material 130 is in electrical communication with the channel material 114 through the conductive material 122, as used herein, the channel material 114, the conductive material 122, and the channel material 130 may be collectively referred to as a channel region of the electronic device 100. The channel material 130 may comprise sharp corners or, alternatively, the channel material 130 may comprise rounded corners, as shown in FIG. 1A.

The insulative material 134 may be formed of and include one or more of the materials described above with reference to the insulative material 112. In some embodiments, the insulative material 134 comprises substantially the same material composition as the insulative material 112. In some embodiments, the insulative material 134 comprises silicon dioxide. In some embodiments, the electronic device 100 is exposed to a planarization process, such as a CMP process, after forming the insulative material 134. Portions (e.g., upper portions) of the insulative material 134 may be removed from within the upper pillars 126 to form a recess. The recess may be filled with additional channel material to form a horizontally extending portion 136 of the channel material 130. The insulative material 134 may, therefore, be surrounded by the channel material 130 and the horizontally extending portion 136 of the channel material 130. The additional channel material may comprise the same material composition as the channel material 130.

As shown in FIG. 1A, support structures 132 may be formed to provide additional mechanical integrity and support to portions of the tiers 102, 124 of the insulative structures 104 and the other insulative structures 106. In some embodiments, the support structures 132 are positioned within or proximal to regions of the stacks 101, 105 prone to tier collapse during subsequent processing acts (e.g., subsequent material removal acts). In some embodiments, the support structures 132 are positioned horizontally proximal one or more areas designated for the pillars 110 and the upper pillars 126. In other embodiments, the support structures 132 are positioned horizontally proximal to regions designated for slots (e.g., slots 133 (FIG. 1B)), in regions outside of boundaries of regions designated for the pillars 110 and the upper pillars 126. In some such embodiments, the electronic device 100 may include the support structures 132 between horizontally neighboring portions of the slots 133 that are substantially absent (e.g., substantially devoid) of the pillars 110 and the upper pillars 126.

The support structures 132 may be formed in openings extending vertically through the tiers 102, 124 of the stacks 101, 105. The support structures 132 may include one or more materials. For example, the support structures 132 may individually include a liner 132a, and a fill material 132b surrounded by the liner 132a. For each of the support structures 132, the liner 132a may be formed (e.g., conformally formed) within the openings formed in the stacks 101, 105. The liner 132a may be continuous along a vertical distance of each of the stack 101 and the stack 105. The liner 132a may be formed of and include insulative material, such as a dielectric oxide material. For example, the material of the liner 132a may include a silicon oxide material (e.g., relatively high quality, highly conformal silicon oxide material, such as an ALD $SiO_x$). A material composition of the liner 132a may be substantially the same as a material composition of the insulative structures 104 of the stacks 101, 105, or the material composition of the liner 132a may be different than the material composition of the insulative structures 104. In some embodiments, a material composition of the liner 132a is substantially the same as a material composition of the insulative structures 104 (e.g., $SiO_2$). The material of the liner 132a may exhibit etch selectivity with respect to the other insulative structures 106. The liner 132a may be formed by conventional techniques, such as by CVD or ALD. In some embodiments, the liner 132a is formed by plasma enhanced ALD (PEALD).

The fill material 132b of the support structures 132 may be formed adjacent (e.g., over) the liner 132a. In some embodiments, the fill material 132b may be formed of and include an insulative material, such as a silicon oxide material. In other embodiments, the fill material 132b may be formed of and include a conductive material including, but not limited to, n-doped polysilicon, p-doped polysilicon, undoped polysilicon, or a metal, such as tungsten. The liner 132a may substantially surround sidewalls of the fill material 132b. In some embodiments, such as where the fill material 132b comprises an insulative material, the support structures 132 may not include the liner 132a on sidewalls of the fill material 132b, and the support structures 132 may only include the fill material 132b (e.g., the insulative material).

The fill material 132b of the support structures 132 may be formed to substantially fill remaining portions of the openings extending vertically through the stacks 101, 105 and to the source 103. At least some of the support structures 132 may be formed to extend vertically from the vertically uppermost surface of the stack 105, through the stack 101, and to the upper surface of the source 103. Alternatively or additionally, at least some of the support structures 132 (e.g., including the conductive material as the fill material 132b) may be formed to extend below the upper surface of the source 103. In some embodiments, the support structures 132 are configured to provide one or more functions (e.g., electrical connections) in addition to support functions. In additional embodiments, the support structures 132 are configured to substantially only provide support functions. Upper surfaces of the upper pillars 126 and the support structures 132 may be substantially coplanar with one another, in some embodiments. In other embodiments, the upper surfaces of the support structures 132 extend beyond (e.g., in the Z-direction) the upper surfaces of the upper pillars 126.

The support structures 132 may individually exhibit a substantially circular cross-sectional shape, as shown in the top-down view of FIG. 1B. However, the disclosure is not so limited. As a non-limiting example, in additional embodiments, the support structures 132 individually exhibit a substantially rectangular cross-sectional shape (e.g., a substantially square cross-sectional shape), or a different elongate cross-sectional shape (e.g., an oblong cross-sectional shape). A lateral dimension (e.g., a width, a diameter in a horizontal direction) of one or more of the support structures 132 may be relatively larger than a lateral dimension of one or more (e.g., each) of the pillars 110 and the upper pillars 126. While two of the support structures 132 are shown in FIG. 1B for clarity, the disclosure is not so limited, and the stacks 101, 105 of the electronic device 100 may include a different number of the support structures 132.

Referring to FIG. 1B, some of the pillars 110 may be aligned with each other (e.g., in the Y-direction) and other of the pillars 110 may be offset from each other (e.g., in the Y-direction). The pillars 110 may be arranged in a weave pattern (e.g., a hexagonal close-packed arrangement), which may facilitate an increased density of the pillars 110 (and the resulting strings of memory cells) in the stack 101. The pillars 110 may be arranged in rows 107 extending in a first horizontal (e.g., lateral) direction (e.g., in the X-direction) and columns 109 extending in a second horizontal direction (e.g., in the Y-direction). In some embodiments, the pillars 110 in a column 109 may be substantially horizontally aligned (e.g., in each of the X-direction and the Y-direction) with the pillars 110 in a neighboring (e.g., adjacent) column 109. In addition, the pillars 110 of every other column 109 may be horizontally aligned (e.g., in the Y-direction). Similarly, the pillars 110 of a row 107 may be substantially horizontally aligned (e.g., in each of the X-direction and the Y-direction) with the pillars 110 in a neighboring (e.g., adjacent) row 107. In addition, the pillars 110 of every other row 107 may be substantially horizontally aligned (e.g., in the X-direction). In FIG. 1B, the pillars 110 are illustrated in broken lines to indicate that they are located below an upper surface of the electronic device 100.

A pitch between horizontally neighboring (e.g., in the Y-direction, a direction in which the slots will be formed) pillars 110 may be within a range from about 120 nanometers (nm) to about 180 nm, such as from about 120 nm to about 140 nm, from about 140 nm to about 160 nm, or from about 160 nm to about 180 nm. In some embodiments, the pitch is from about 140 nm to about 150 nm or from about 150 nm to about 160 nm. However, the disclosure is not so limited and the pitch may be different than that described.

With continued reference to FIG. 1B, the upper pillars 126 may be similarly arranged in the rows 107 extending in the first horizontal (e.g., lateral) direction (e.g., in the X-direction) and in the columns 109 extending in the second horizontal direction (e.g., in the Y-direction). For example, the upper pillars 126 in a column 109 may be substantially horizontally aligned (e.g., in each of the X-direction and the Y-direction) with the upper pillars 126 in at least one neighboring (e.g., adjacent) column 109. Each of the upper pillars 126 may be substantially horizontally aligned (e.g., in each of the X-direction and the Y-direction) with a center of the vertically underlying (e.g., in the Z-direction) pillars 110. In other words, the upper pillars 126 may be substantially horizontally aligned with a center of a respective pillar 110. Accordingly, at least some (e.g., each) of the upper pillars 126 may be concentric with the center of the underlying pillars 110.

In other embodiments, at least some of the upper pillars 126 (e.g., additional upper pillars 126') may be horizontally offset in at least one horizontal direction (e.g., the X-direction) from the center of the underlying pillars 110, without being centered over a respective pillar 110, as shown for illustrative purposes in the fourth column from the left-hand side of the electronic device 100 of FIG. 1B. While FIG. 1A shows the upper pillars 126 being horizontally aligned with a respective pillar 110, at least some of the upper pillars 126 may be horizontally offset from the center of the underlying pillars 110. Although FIG. 1B illustrates three of the additional upper pillars 126' in a single column 109, the disclosure is not so limited. For example, the electronic device 100 may include additional columns 109 of the additional upper pillars 126' in regions designated for slots separating blocks of the electronic device 100 into one or more sub-blocks. In other words, the slots may include the columns 109 of the additional upper pillars 126' on opposing sides thereof, while the columns 109 that are spaced from the slots may include the upper pillars 126 that are concentric with the center of the underling pillars 110. In additional embodiments, each of the columns 109 may include the additional upper pillars 126' that are horizontally offset from the center of the underlying pillars 110.

As shown in FIG. 1B, each of the pillars 110 and the upper pillars 126 may individually exhibit a substantially circular cross-sectional shape. However, the disclosure is not so limited, and additional configurations may be contemplated. For example, one or more of the pillars 110 and the upper pillars 126 may individually exhibit a substantially rectangular cross-sectional shape (e.g., a substantially square cross-sectional shape).

After forming the support structures 132, the slots 133 may be formed through the additional stack 105 and the stack 101. The slots 133 may be referred to herein as so-called "replacement gate" slots. The slots 133 may be formed by removing portions of the materials of the additional stack 105, the etch stop material 125, if present, the dielectric material 108, and the stack 101. The materials of the additional stack 105, the etch stop material 125, the dielectric material 108, and the stack 101 may, for example, be removed by one or more etch processes. In some embodiments, the slots 133 expose at least a portion of the source 103. The electronic device 100 may include the slots 133 that are horizontally spaced from each other (e.g., in the X-direction) by the columns 109 of the pillars 110 and the upper pillars 126. The electronic device 100 may be divided into blocks 140 between horizontally neighboring (e.g., in the X-direction) slots 133. Although FIG. 1B illustrates only a portion of one block 140, it will be understood that the electronic device 100 may include several blocks 140. As described below, the blocks 140 may be divided into one or more sub-blocks.

Referring to FIG. 1C, after forming the slots 133 (FIG. 1B), the other insulative structures 106 (FIG. 1A) of the stack 101 may be removed through the slots 133 as part of a so-called "replacement gate" or "gate last" process. By way of non-limiting example, the other insulative structures 106 may be removed by exposing the other insulative structures 106 to a wet etchant comprising one or more of phosphoric acid, sulfuric acid, hydrochloric acid, nitric acid, or another material. In some embodiments, the other insulative structures 106 are removed by exposing the other insulative structures 106 to a so-called "wet nitride strip" comprising a wet etchant comprising phosphoric acid. In some embodiments, the other insulative structures 106 of the stack 101 and of the additional stack 105 may be removed simultaneously through the slots 133.

After removal of the other insulative structures 106 (FIG. 1A), conductive structures 142 may be formed between the neighboring insulative structures 104, forming tiers 144 of the insulative structures 104 and the conductive structures 142 of the stack 101 and tiers 144 of the insulative structures 104 and additional conductive structures 145 of the additional stack 105. The additional conductive structures 145 may comprise the same material composition as the conductive structures 142. For clarity, the insulative structures 104 of the additional stack 105 may be referred to here as additional insulative structures 104. The conductive structures 142 of the stack 101 may function as local word line structures (e.g., local or word line plates). Lower portions of the upper pillars 126 may be laterally adjacent to the additional conductive structures 145, and upper portions of the upper pillars 126 may be located above an uppermost additional conductive structures 145. The additional conductive structures 145 of the additional stack 105 may function as select gate structures, such as select gate drain (SGD) structures. Accordingly, the additional conductive structures 145 within the upper portion of the tiers 144 may function as so-called "de-integrated SGDs."

The conductive structures 142 and the additional conductive structures 145 may each individually be formed of and include a conductive material. In some embodiments, the conductive structures 142 and the additional conductive structures 145 comprise tungsten. In other embodiments, the conductive structures 142 and the additional conductive structures 145 comprise conductively doped polysilicon.

In some embodiments, the conductive structures 142 may include a conductive liner material (not shown) around the conductive structures 142, such as between the conductive structures 142 and the insulative structures 104. In addition, the additional conductive structures 145 may include a conductive liner material (not shown) around the additional conductive structures 145, such as between the additional conductive structures 145 and the insulative structures 104. The conductive liner material may comprise, for example, a seed material from which the conductive structures 142 and additional conductive structures 145 may be formed. The conductive liner material may be formed of and include, for example, a metal (e.g., titanium, tantalum), a metal nitride (e.g., tungsten nitride, titanium nitride, tantalum nitride), or another material. In some embodiments, the conductive liner material comprises titanium nitride.

Formation of the conductive structures 142 may form strings 160 of memory cells 162. The memory cells 162 of the strings 160 may be located at intersections of the pillars 110 and the conductive structures 142, and may individually include a portion of one of the pillars 110 and a portion of one of the conductive structures 142. Vertically neighboring memory cells 162 of the strings 160 may be separated from each other by one of the insulative structures 104.

After forming the conductive structures 142 and the additional conductive structures 145, the slots 133 may be filled with a dielectric material (e.g., dielectric material 146 (see FIG. 1H)). The dielectric material 146 may extend through the additional stack 105 and the stack 101. Accordingly, the dielectric material 146 may physically separate neighboring (e.g., adjacent) blocks 140 (FIG. 1H) of the electronic device 100. The dielectric material 146 may comprise one or more of the materials described above with reference to the insulative material 112. In some embodiments, the dielectric material 146 comprises substantially the same material composition as the insulative material 112 (e.g., $SiO_2$).

As shown in FIG. 1C, a barrier material 131 (e.g., an etch stop material) may be formed over the electronic device 100. The barrier material 131 may comprise one or more of the materials described above with reference to the etch stop material 125. In some embodiments, the barrier material 131 comprises substantially the same material composition as the etch stop material 125 (e.g., silicon carbon nitride (SiCN)). In other embodiments, the barrier material 131 comprises a nitride material (e.g., a silicon nitride material, an oxynitride material), although other materials may be contemplated, so long as the barrier material 131 exhibits etch selectivity relative to surrounding materials.

After forming the barrier material 131, an upper insulative material 148 may be formed adjacent to (e.g., on or over) the barrier material 131. While FIG. 1C illustrates the upper insulative material 148 as a single material for convenience, multiple materials may be present. For example, the upper insulative material 148 may be formed to include a first upper insulative material adjacent to (e.g., on or over) the barrier material 131, and a second upper insulative material adjacent to (e.g., on or over) the first upper insulative material, collectively referred to herein as the upper insulative material 148.

The upper insulative material 148 may be formed of and include at least one dielectric material. In some embodiments, the upper insulative material 148 is formed of and includes $SiO_2$. A material composition of the upper insulative material 148 may be substantially the same as or different than a material composition of the insulative structures 104 of the tiers 144 of the stacks 101, 105. The uppermost insulative structure 129 of the additional stack 105 and the upper insulative material 148 are separated from one another by the barrier material 131.

Referring to FIG. 1D, portions of the upper insulative material 148 and the barrier material 131 overlying the upper pillars 126 may be removed through one or more material removal process acts to form openings 138 (e.g., contact openings) overlying the upper pillars 126. A conductive material 150 may be formed in (e.g., deposited into) the openings 138, and portions of the conductive material 150 may be removed (e.g., through a CMP process) to form conductive contacts 152 (e.g., contacts, bit line contacts). The conductive contacts 152 may be formed over and in electrical communication with the channel material 130 of the upper pillars 126. The conductive contacts 152 may be electrically coupled to conductive lines (e.g., bit lines) configured for selectively coupling to the strings 160 of the memory cells 162. As shown in FIG. 1D, additional conductive contacts 152 may be formed over at least some of the support structures 132. The conductive material 150 of the additional conductive contacts 152 may be coupled to the fill material 132b (e.g., a conductive material) of the support structures 132. A height of the additional conductive contacts 152 overlying the support structures 132 may be substantially equal to a height of the conductive contacts 152 overlying the upper pillars 126.

The conductive contacts 152 of the electronic device 100 may be formed prior to separating the blocks 140 (FIG. 1B) into sub-blocks, which processes differ from conventional processes of forming conventional electronic devices including sub-block separation prior to formation of conductive contacts. As described below, the sub-blocks may be separated from one another by additional slots following formation of the conductive contacts 152 using a self-alignment process to reduce cost and the number of process acts conducted.

The conductive material 150 of the conductive contacts 152 may comprise an electrically conductive material, such as one or more of the materials described above with reference to the conductive structures 142. In some embodiments, the conductive material 150 of the conductive contacts 152 comprises substantially the same material composition as the conductive structures 142 (e.g., tungsten).

The conductive contacts 152 may each include outer side surfaces, upper surfaces, and lower surfaces on or over (e.g., directly vertically adjacent to) upper surfaces of the upper pillars 126. The outer side surfaces (e.g., sidewalls) of the conductive contacts 152 may exhibit a tapered profile with an upper portion of individual conductive contacts 152 having a greater critical dimension (e.g., width) than a lower portion thereof, as shown in FIG. 1D. In other embodiments, the conductive contacts 152 have a different profile, for example, a substantially rectangular profile, a dish-shaped profile, or any other three-dimensional shape, such that portions (e.g., a lateral extent of the upper surfaces) of the conductive contacts 152 extend beyond sidewalls of the upper pillars 126 in at least one lateral direction (e.g., the X-direction).

The conductive material 150 may include sacrificial portions 151 and remaining portions of the conductive material 150 adjacent to the sacrificial portions 151. For example, the sacrificial portions 151 of the conductive material 150 may initially be present in one or more areas (shown in dashed lines) designated for subsequently formed structures (e.g., isolation structures within additional slots), as described below with reference to FIG. 1G. The remaining portions of the conductive material 150 may be present in regions adjacent to the areas designated for the subsequently formed structures. For example, the conductive material 150 may be formed within a horizontally boundary of the conductive contacts 152 and may initially be formed to include a substantially continuous material in the openings 138 of the upper insulative material 148. The remaining portions of the conductive material 150 of the conductive contacts 152 may remain in the electronic device 100 following formation of the subsequently formed structures.

As shown in FIG. 1D, an outer dimension of the pillars 110 may be relatively larger than an outer dimension of the upper pillars 126. For example, a dimension $D_1$ (e.g., a diameter) of the pillars 110 may be within a range from about 90 nm to about 150 nm, such as from about 90 nm to about 100 nm, from about 100 nm to about 110 nm, from about 110 nm to about 120 nm, from about 120 nm to about 130 nm, from about 130 nm to about 140 nm, or from about 140 nm to about 150 nm. In some embodiments, the dimension $D_1$ is about 120 nm. However, the disclosure is not so limited and the dimension $D_1$ may be different than those described. An outer dimension $D_2$ (e.g., a diameter) of a lower portion of the upper pillars 126 may be within a range from about 30 nm to about 120 nm, such as from about 30 nm to about 40 nm, from about 40 nm to about 60 nm, from about 60 nm to about 80 nm, from about 80 nm to about 100 nm, or from about 100 nm to about 120 nm. In some embodiments, the dimension $D_2$ may be within a range from about 50 nm to about 60 nm, such as about 55 nm. In addition, an outer dimension $D_3$ (e.g., a diameter) of an upper portion of the upper pillars 126 may be within a range from about 50 nm to about 140 nm, such as from about 50 nm to about 60 nm, from about 60 nm to about 80 nm, from about 80 nm to about 100 nm, from about 100 nm to about 120 nm, or from about 120 nm to about 140 nm. In some embodiments, the dimension $D_3$ is from about 65 nm to about 75 nm, such as about 70 nm. In some embodiments, the dimension $D_3$ is larger than the dimension $D_2$ and sidewalls of the upper pillars 126 may exhibit a tapered (e.g., angled) shape with respect to a major surface of the source 103. In some embodiments, the dimension $D_1$ of the pillars 110 is about twice as large as the dimension $D_3$. Horizontal (e.g., lateral) boundaries of the upper pillars 126 may not extend beyond horizontal boundaries of the pillars 110. In other words, the dimension $D_3$ may be sized such that the upper pillars 126 do not laterally extend beyond the horizontal boundary of the pillars 110.

Further, an outer dimension $D_4$ (e.g., a diameter) of a lower portion of the conductive contacts 152 may be within a range from about 40 nm to about 180 nm, such as from about 40 nm to about 60 nm, from about 60 nm to about 80 nm, from about 80 nm to about 100 nm, from about 100 nm to about 120 nm, from about 120 nm to about 140 nm, from about 140 nm to about 160 nm, or from about 160 nm to about 180 nm. In addition, an outer dimension $D_5$ (e.g., a diameter) of an upper portion of the conductive contacts 152 may be within a range from about 80 nm to about 200 nm, such as from about 80 nm to about 100 nm, from about 100 nm to about 120 nm, from about 120 nm to about 150 nm, or from about 150 nm to about 200 nm. In some embodiments, the dimension $D_5$ is larger than the dimension $D_4$ and sidewalls of the conductive contacts 152 exhibit a tapered (e.g., angled) shape with respect to a major surface of the source 103. In some embodiments, the outer dimension $D_5$ of the upper portion of the conductive contacts 152 may be substantially the same as (e.g., substantially equal to) the dimension $D_1$ of the pillars 110, although other configurations of the dimensions of the conductive contacts 152 relative to the pillars 110 may be contemplated. In addition, the outer dimension $D_5$ of the upper portion of the conductive contacts 152 may be relatively larger than the dimension $D_3$ of the upper portion of the upper pillars 126, such that portions of the conductive contacts 152 extend beyond a horizontal boundary (e.g., lateral edge) of the upper pillars 126, although other configurations of the dimensions of the conductive contacts 152 relative to the upper pillars 126 may be contemplated. The conductive contacts 152 may exhibit a relatively greater taper than a taper of the upper pillars 126. As such, the outer dimension $D_5$ of the upper portion of the conductive contacts 152 may be relatively larger than conventional conductive contacts of conventional electronic devices.

Referring to FIG. 1E, after forming the conductive contacts 152, openings 154 may be formed through the upper insulative material 148 and through portions (e.g., the sacrificial portions 151 (FIG. 1D)) of the conductive contacts 152. The openings 154 may be formed to extend from an upper surface of the upper insulative material 148 to or partially within the barrier material 131 underlying the upper insulative material 148. For example, the openings 154 may be formed by removing portions of the upper insulative material 148 between some of the neighboring conductive contacts 152, as well as removing portions (e.g., the sacrificial portions 151) of the conductive contacts 152. The portions of the upper insulative material 148 and the sacrificial portions 151 of the conductive material 150 may, for example, be removed by one or more material removal processes (e.g., a single etch process). The openings 154 may be formed in locations of subsequently formed additional slots that separate the blocks 140 (FIG. 1B) into sub-blocks, as described below.

In such embodiments, the openings 154, as well as the subsequently formed additional slots, are formed to be self-aligned with the conductive contacts 152 using a so-called "assisted self-alignment" process. Since the conductive contacts 152 are formed prior to separating the blocks 140 (FIG. 1B) into sub-blocks, the processes of forming and the resulting configuration of the electronic device 100 differ from that of conventional electronic devices including conductive contacts overlying pillars. By forming the conductive contacts 152 prior to formation of the openings 154, the resulting additional slots may be self-aligned with the conductive contacts 152.

The openings 154 may be formed (e.g., patterned) using substantially linear (e.g., substantially straight) openings in a resist material (e.g., a photoresist material, a mask material) (not shown) in the Y-direction. Upon formation of the openings 154, uppermost portions thereof may, optionally, exhibit a substantially linear configuration defined by remaining portions (e.g., sidewalls) of the conductive contacts 152 and the upper insulative material 148 responsive to using the substantially linear openings in the resist material. At locations spaced from (e.g., below) upper surfaces of the conductive contacts 152, the openings 154 may exhibit a so-called "weave pattern," responsive to the configuration of the remaining portions of the conductive contacts 152 below the sacrificial portions 151 (FIG. 1D) thereof. The methods of the disclosure including using the substantially linear openings in the resist material, therefore, may reduce or eliminate process acts that are otherwise utilized in many conventional electronic devices to form conventional additional slots laterally adjacent to pillars using a resist material exhibiting a weave pattern. In methods of the disclosure, the weave pattern may be formed without first patterning the resist to include a weave pattern. Thus, the methods of the disclosure may simplify manufacturing processes and reduce complexity of the electronic device 100.

Forming the openings 154 after formation of the conductive contacts 152 may, optionally, result in recessed regions 156, also called "clipping," of the conductive contacts 152 at locations of the sacrificial portions 151 (FIG. 1D). The recessed regions 156 may be responsive to one or more material removal processes (e.g., etch processes) used to remove the upper insulative material 148, which material removal processes may also remove portions of the conductive contacts 152. In other words, the openings 154 may be formed in regions previously occupied by the sacrificial portions 151 of the conductive material 150 and in regions of the upper insulative material 148 between neighboring conductive contacts 152. In some embodiments, the openings 154 may be substantially centered between the neighboring conductive contacts 152, such that substantially equal portions of the conductive material 150 are removed during formation of the openings 154. Accordingly, upper portions of the conductive contacts 152 may be laterally recessed relative to additional portions of the conductive contacts 152 below the recessed regions 156. By forming the conductive contacts 152 to exhibit the outer dimension $D_5$ (FIG. 1D) that is relatively larger than conventional conductive contacts of conventional electronic devices, excess portions of the conductive material 150 of the conductive contacts 152 may be removed, without significantly affecting conductivity.

As shown in FIG. 1E, a slot liner 158 (e.g., a liner material) may be formed within the openings 154. The slot liner 158 may be formed using one or more conformal deposition processes, such as one or more of a conventional conformal CVD process or a conventional ALD process. Since the slot liner 158 is conformally formed, a portion of the openings 154 within the upper insulative material 148 may remain substantially free of the slot liner 158. Accordingly, the slot liner 158 is formed in the openings 154 without fully filling the openings 154. Since the uppermost portions of the openings 154 may, optionally, exhibit a substantially linear configuration and lower portions of openings 154 may exhibit a weave pattern, uppermost portions of the slot liner 158 may, optionally, exhibit a substantially linear configuration and lower portions thereof may exhibit a weave pattern.

The slot liner 158 may be formed of and include one or more dielectric materials, such as a nitride material (e.g., a silicon nitride), an oxynitride material (e.g., silicon oxynitride), and be formulated as an etch stop material, although other materials may be contemplated. By way of non-limiting example, the slot liner 158 may include a carbon-containing nitride material (e.g., a carbon-doped nitride material, a carbon-doped silicon nitride) or a carbon-doped oxide material (e.g., a carbon-doped silicon oxide). The slot liner 158 may, alternatively, be formed of and include a semiconductive material (e.g., undoped polysilicon) or a conductive metal oxide (e.g., aluminum oxide ($AlO_x$), hafnium oxide ($HfO_x$), niobium oxide ($NbO_x$), titanium oxide ($TiO_x$), zirconium oxide ($ZrO_x$), tantalum oxide ($TaO_x$), magnesium oxide (MgO)), so long as the materials of the slot liner 158 exhibit etch selectivity relative to surrounding materials, including the materials of the additional stack 105. In some embodiments, the slot liner 158 comprises substantially the same material composition as the barrier material 131 (e.g., silicon carbon nitride (SiCN)). In other embodiments, the slot liner 158 comprises zirconium oxide ($ZrO_x$).

The slot liner 158 may have a thickness within a range of from about 10 nm to about 40 nm, such as from about 10 nm to about 20 nm, from about 20 nm to about 30 nm, or from about 30 nm to about 40 nm. However, the disclosure is not so limited and the thickness of the slot liner 158 may be different than those described above. In some embodiments, a so-called "punch through" etch is then performed to remove portions of the slot liner 158 and expose the underlying portions of the barrier material 131. In some embodiments, lowermost surfaces of remaining portions of the slot liner 158 extend to or beyond upper surfaces of the barrier material 131. In other embodiments, a portion of the upper insulative material 148 may be laterally exposed below the lowermost surfaces of the slot liner 158, such that the slot liner 158 terminates above an elevational level of the barrier material 131.

Referring to FIG. 1F, following formation of the slot liner 158, extended openings 154' may be formed through the tiers 144 of the insulative structures 104 and the additional conductive structures 145 of the additional stack 105 underlying the openings 154 (FIG. 1E). In some embodiments, the extended openings 154' are formed by sequentially removing the tiers 144 of the insulative structures 104 and the additional conductive structures 145. The portions of the insulative structures 104 and the additional conductive structures 145 may, for example, be removed by one or more etch processes. The extended openings 154' may be formed to be self-aligned with the openings 154. Accordingly, the extended openings 154' may be formed within horizontal areas of the openings 154 and extend below a lower boundary of the slot liner 158. The openings 154 may be formed using a first material removal process (e.g., a first etch process) and the extended openings 154' may be formed using a second material removal process (e.g., a second etch process) following formation of the slot liner 158.

In some embodiments, the extended openings 154' terminate within a lowermost one of the tiers 144 of the additional stack 105 (e.g., a lowermost additional conductive structure 145a). In some such embodiments, the lowermost additional conductive structure 145a may be substantially continuous within the blocks 140 (FIG. 1B). By way of comparison, the extended openings 154' may segment the additional conductive structures 145 of the tiers 144 of the additional stack 105 (other than the lowermost additional conductive structure 145*a*) into different portions such that the additional conductive structures 145 are not substantially continuous within the blocks 140. Rather, such additional conductive structures 145 may be segmented by the extended openings 154'.

A lower portion of the extended openings 154' laterally adjacent to the additional conductive structures 145 of the additional stack 105 may exhibit a so-called "weave" pattern wherein the lower portion of the extended openings 154' is not defined by sidewalls of the additional stack 105 extending in a substantially straight line (e.g., extending in the Y-direction (see FIG. 1H)). Rather, the lower portion of the extended openings 154' may extend between the upper pillars 126 and may exhibit a non-linear (e.g., non-straight, curved, arcuate) shape that at least partially conforms to the layout (e.g., the shape) of the strings 160 of the memory cells 162 and the upper pillars 126. In addition, the upper portion of the extended openings 154' (e.g., laterally adjacent to the slot liner 158) may extend between the conductive contacts 152 and may exhibit a non-linear shape to at least partially conform to the layout (e.g., the shape) of the conductive contacts 152. Optionally, an uppermost portion of the extended openings 154' may exhibit a substantially rectangular cross-sectional shape with substantially linear portions (e.g., substantially straight portions) extending in the Y-direction. Accordingly, the upper portion of the extended openings 154' including the slot liner 158 may extend at an elevational level of the conductive contacts 152 and uppermost portions thereof may, optionally, exhibit a substantially linear shape. The differing portions of the extended openings 154' including the weave pattern of the lower portion and the substantially linear shape of the uppermost portion, may be responsive to material removal processes used to sequentially remove the tiers 144 of the insulative structures 104 and the additional conductive structures 145 of the additional stack 105 during formation of the extended openings 154'. For example, the slot liner 158 may provide adequate structure to maintain the substantially linear shape of the uppermost portion of the extended openings 154' laterally adjacent to the upper surfaces of the conductive contacts 152, while additional portions of the extended openings 154' below the upper surfaces of the conductive contacts 152 conform to the weave pattern (e.g., the hexagonal close-packed arrangement) of the conductive contacts 152 and the lower portion of the extended openings 154' conforms to the weave pattern (e.g., the hexagonal close-packed arrangement) of the upper pillars 126 and the pillars 110. In other words, the additional portions of the extended openings 154' may be self-aligned with the conductive contacts 152 and be formed to exhibit a weave shape with arcuate surfaces and the lower portion of the extended openings 154' may be self-aligned with the upper pillars 126 and be formed to exhibit a weave shape with arcuate surfaces, without conducting additional patterning and etching processes. Since the dimensions of the conductive contacts 152 and the upper pillars 126 differ from one another, the weave pattern of the extended openings 154' laterally adjacent to the conductive contacts 152 may differ from the weave pattern of the lower portion of the extended openings 154' laterally adjacent to the upper pillars 126, as described below.

As shown in FIG. 1F, a dimension $D_6$ (e.g., width) of a lower portion of the extended openings 154' (e.g., within the additional stack 105) may be within a range from about 5 nm to about 80 nm, such as from about 5 nm to about 10 nm, 10 nm to about 20 nm, from about 20 nm to about 40 nm, from about 40 nm to about 60 nm, or from about 60 nm to about 80 nm. In some embodiments, the dimension $D_6$ is about 25 nm. However, the disclosure is not so limited and the dimension $D_6$ may be different than those described. In some embodiments, the dimension $D_6$ is substantially uniform across a width (e.g., in the X-direction) of the lower portion of the extended openings 154'. Accordingly, even though the lower portions of the extended openings 154' exhibit the weave shape with arcuate surfaces, the dimension $D_6$ may be substantially uniform. In addition, a dimension $D_7$ (e.g., width) of an upper portion of the extended openings 154' (e.g., laterally adjacent to the slot liner 158) may be within a range from about 20 nm to about 140 nm, such as from about 20 nm to about 40 nm, from about 40 nm to about 60 nm, from about 60 nm to about 80 nm, from about 80 nm to about 100 nm, from about 100 nm to about 120 nm, or from about 120 nm to about 140 nm. In some embodiments, the dimension $D_7$ is about 45 nm. However, the disclosure is not so limited and the dimension $D_7$ may be different than those described.

In some embodiments, the dimension $D_7$ is substantially uniform across a width (e.g., in the X-direction) of the uppermost portion of the extended openings 154'. Accordingly, the uppermost portion of the extended openings 154' may, optionally, exhibit a substantially rectangular cross-sectional shape with substantially linear (e.g., substantially straight) surfaces, with the dimension $D_7$ substantially uniform along a length of the uppermost portion of the extended openings 154'. In other words, the uppermost portion of the extended openings 154' may not exhibit a weave pattern. In locations below the uppermost portion of the extended openings 154', the extended openings 154' may exhibit the weave shape with arcuate surfaces. In some embodiments, the dimension $D_7$ is substantially uniform across a width (e.g., in the X-direction) of the upper portion of the extended openings 154'. Accordingly, even though the additional portions of the extended openings 154' exhibit the weave shape with arcuate surfaces, the dimension $D_7$ may be substantially uniform. In some embodiments, the dimension $D_7$ of the upper portion of the extended openings 154' may be greater than a distance between horizontally neighboring strings 160 of memory cells 162. Further, the dimension $D_7$ of the upper portion of the extended openings 154' may be greater than a distance between horizontally neighboring conductive contacts 152, resulting in the recessed regions 156 (FIG. 1E). For example, the dimension $D_7$ of the extended openings 154' may be selected and tailored to effect a size and shape of one or more features to be formed in the electronic device 100, as described below.

Referring collectively to FIGS. 1G and 1H, the extended openings 154' (FIG. 1F) may be filled with a dielectric material 164 to form additional slots 168 (e.g., additional dielectric-filled slots). Formation of the dielectric material 164 results in formation of isolation structures 166 within the additional slots 168. The additional slots 168 and the isolation structures 166 are described in further detail below, along with additional components (e.g., structures, features) of the electronic device 100 at the processing stage depicted in FIG. 1G. A cross-section of the electronic device 100 along the G-G line of FIG. 1H is shown in FIG. 1G. For clarity and ease of understanding the drawings and associated description, surrounding materials including the barrier material 131, the upper insulative material 148, and the conductive contacts 152 are absent in FIG. 1H.

The dielectric material 164 may be formed within the extended openings 154' (FIG. 1F) with portions (e.g., lower portions) of the dielectric material 164 laterally adjacent to (e.g., directly contacting) one or more (e.g., each) of the barrier material 131, the uppermost insulative structure 129, and the tiers 144 of the insulative structures 104 and the additional conductive structures 145 of the additional stack 105. Additional portions (e.g., upper portions) of the dielectric material 164 may be laterally adjacent to (e.g., directly contacting) the slot liner 158, without contacting the upper insulative material 148. In other words, the slot liner 158 laterally separates the dielectric material 164 from the upper insulative material 148. In other embodiments, portions of the dielectric material 164 may be directly laterally adjacent to the upper insulative material 148, such as when the slot liner 158 vertically terminates above the barrier material 131.

As shown in FIG. 1G, the isolation structures 166 may include a first portion 166a (e.g., a lower portion) laterally adjacent to the additional conductive structures 145 and the uppermost insulative structure 129 of the additional stack 105. In addition, the isolation structures 166 may include a second portion 166b (e.g., an upper portion) overlying the first portion 166a and extending to a location above an elevational level of the uppermost insulative structure 129, such as laterally adjacent to the barrier material 131, as well as to the conductive contacts 152 within the upper insulative material 148. Further, the isolation structures 166 may, optionally, include a third portion 166c (e.g., an uppermost portion, a substantially linear portion) overlying the second portion 166b. While interfaces between the first portion 166a, the second portion 166b, and the third portion 166c of the isolation structures 166 are shown in dashed lines, for clarity, the first portion 166a, the second portion 166b, and the third portion 166c of the isolation structures 166 may include substantially the same material composition with no easily discernable physical interface therebetween.

The dielectric material 164 of the additional slots 168 may comprise one or more of the materials described above with reference to the dielectric material 146 of the slots 133. In some embodiments, the dielectric material 164 comprises substantially the same material composition as the dielectric material 146 (e.g., $SiO_2$). After forming the dielectric material 164 within the additional slots 168, portions of the dielectric material 164 located outside of the additional slots 168 may be removed, such as by subjecting the electronic device 100 to a CMP process.

As shown in FIG. 1G, in combination with FIG. 1H, the additional slots 168 including the dielectric material 164 may be formed through the upper insulative material 148, as well as through the tiers 144 of the insulative structures 104 and the additional conductive structures 145 of the additional stack 105 at locations of the extended openings 154' (FIG. 1F). Thus, the additional slots 168 are laterally adjacent to the conductive contacts 152. The additional slots 168 may segment the blocks 140 into sub-blocks 178, each defined within horizontal boundaries between neighboring additional slots 168. Since the extended openings 154' terminate within a lowermost one of the tiers 144 of the additional stack 105 (e.g., the lowermost additional conductive structure 145a), the additional slots 168 may terminate at or within the lowermost additional conductive structure 145a.

In some embodiments, the lowermost additional conductive structure 145a may comprise a so-called "dummy" word line structure. In use and operation of the electronic device 100, a voltage may be applied to the lowermost additional conductive structure 145a, which may facilitate an improved current flow through the channel material 130 horizontally proximate the lowermost additional conductive structure 145a and through the interdeck region 111. The continuous lowermost additional conductive structure 145a may facilitate application of the voltage proximate substantially all of the upper pillars 126 within the blocks 140. In addition, in some embodiments, uppermost conductive structures 142 of the stack 101 may comprise dummy word line structures. Similarly, application of a voltage to the uppermost conductive structures 142 may facilitate improved flow of current through the channel material 130 proximate the interdeck region 111.

Portions (e.g., upper portions) of the dielectric material 164 of the additional slots 168 may extend vertically over (e.g., in the Z-direction) portions of each of the pillars 110 neighboring the additional slots 168. In some embodiments, the dielectric material 164 of the additional slots 168 vertically overlie and are located within horizontal boundaries of underlying strings 160 of memory cells 162. The additional slots 168 including the dielectric material 164 may be sized and shaped to facilitate electrical isolation of the additional conductive structures 145 and may be physically spaced (e.g., separated) from the upper pillars 126. Additional portions of the dielectric material 164 of the additional slots 168 may be physically spaced from lower portions of the conductive contacts 152, while the dielectric material 164 in the upper portions of the additional slots 168 may, optionally, be within the recessed regions 156 (FIG. 1E) and immediately adjacent to the slot liner 158, which, in turn, is immediately adjacent to the conductive material 150 (FIG. 1F) of the conductive contacts 152, as described above.

Formation of the dielectric material 164 of the additional slots 168 results in formation of the isolation structures 166 (e.g., filled slot structures) within the extended openings 154' (FIG. 1F). The isolation structures 166 may be formed adjacent to (e.g., directly laterally adjacent to) one or more (e.g., each) of the conductive contacts 152, the upper insulative material 148, the barrier material 131, and the tiers 144 of the insulative structures 104 and the additional conductive structures 145 of the additional stack 105. Thus, the isolation structures 166 are defined by the dielectric material 164 and the slot liner 158 within the additional slots 168. The dielectric material 164 of the isolation structures 166 may be formed over exposed portions of the lowermost additional conductive structure 145a and may fill (e.g., substantially fill) the extended openings 154'.

Portions of the isolation structures 166 (e.g., the second portion 166b and the third portion 166c thereof) may directly contact the upper portion of the conductive contacts 152, and additional portions of the isolation structures 166 (e.g., the second portion 166b thereof) may be separated from the lower portion of the conductive contacts 152 by the upper insulative material 148. The first portion 166a of the isolation structures 166 may be separated from the upper pillars 126 by the tiers 144 of the insulative structures 104 and the additional conductive structures 145 of the additional stack 105. During formation of the isolation structures 166, the first portion 166a may be self-aligned with the upper pillars 126, and the second portion 166b may be self-aligned with the conductive contacts 152, such that each of the first portion 166a and the second portion 166b exhibit a weave pattern. In contrast, the third portion 166c of the isolation structures 166, if present, may include substantially linear portions proximal (e.g., immediately adjacent to) the upper surfaces of the conductive contacts 152.

The substantially linear portions of the third portion 166c of the isolation structures 166 may be responsive to material removal processes (e.g., etch processes) using the resist material having substantially linear openings aligned in the Y-direction, as described above. In other words, formation of the openings 154 (FIG. 1E) may include uppermost portions having a substantially linear configuration defined by remaining portions (e.g., sidewalls) of the conductive contacts 152 and the upper insulative material 148 immediately adjacent to the upper surfaces of the respective materials. At locations spaced from (e.g., below) the upper surfaces of the conductive contacts 152, the openings 154 exhibit the weave pattern, based at least in part on remaining portions of the conductive contacts 152 below the recessed regions 156 (FIG. 1E) of the conductive contacts 152.

In some embodiments, the weave pattern of the second portion 166b of the isolation structures 166 immediately below the third portion 166c thereof may exhibit a greater wavelength (e.g., distance between like points) relative to lower portions of the second portion 166b thereof. Further, the first portion 166a of the isolation structures 166 below the second portion 166b thereof may exhibit a greater wavelength in the weave pattern compared to the weave pattern of the second portion 166b. In other words, the isolation structures 166 may exhibit a relatively shallow weave pattern near the upper surfaces of the conductive contacts 152 and exhibit a progressively tighter weave pattern with increased distances from the upper surfaces of the conductive contacts 152. The differing wavelengths in the weave patterns of the isolation structures 166 may be responsive to the differing sizes and shapes (e.g., tapered profiles) of the conductive contacts 152 relative to the upper pillars 126. The weave patterns of the first portion 166a and the second portion 166b may be formed without having previously patterned the resist to include a weave pattern.

In some embodiments, upper surfaces of the dielectric material 164 within the additional slots 168 and, hence, the isolation structures 166 are substantially coplanar with upper surfaces of the conductive contacts 152. In other words, upper surfaces of the isolation structures 166 extend beyond an upper boundary of the additional stack 105. A lateral extent (e.g., a width) of the isolation structures 166 (e.g., the third portion 166c thereof) may be relatively greater than a distance between horizontally neighboring conductive contacts 152. Since the upper portions of the additional slots 168 are within the recessed regions 156 (FIG. 1E) of the conductive contacts 152, portions of the isolation structures 166 are in vertical alignment with portions of the conductive contacts 152. Thus, one or more non-conductive materials (e.g., the slot liner 158, the dielectric material 164) may be formed in locations previously occupied by the conductive material 150 (e.g., the sacrificial portions 151 (FIG. 1D) thereof) of the conductive contacts 152. For example, the slot liner 158 is located on opposing lateral sides of the dielectric material 164 within regions of the second portion 166b of the isolation structures 166 and the third portion 166c thereof, without the slot liner 158 being laterally adjacent to the dielectric material 164 within the first portion 166a of the isolation structures 166. Further, the slot liner 158 may be continuous along a length (e.g., a horizontal distance in the Y-direction) of the dielectric material 164 above an elevational level of the barrier material 131.

As shown in FIG. 1G, remaining portions of the conductive material 150 of the conductive contacts 152 are maintained (e.g., remain) laterally adjacent to the isolation structures 166. As such, the remaining portions of the conductive contacts 152 extend beyond the horizontal boundary (e.g., lateral edge) of the upper pillars 126 and protect the upper pillars 126 from being removed (e.g., exhumed) during the material removal processes of the materials of the additional stack 105. The additional conductive structures 145 of the additional stack 105, the uppermost insulative structure 129, and the barrier material 131, are laterally adjacent to the first portion 166a of the isolation structures 166. The remaining portions of the conductive material 150 of the conductive contacts 152 are laterally adjacent to the second portion 166b and the third portion 166c of the isolation structures 166. Accordingly, the first portion 166a of the isolation structures 166 (also described herein as first isolation structures 170 (e.g., lower isolation structures)) of an individual additional slot 168 may be located below a lowermost boundary of the second portion 166b of the isolation structures 166 (also described herein as second isolation structures 172 (e.g., upper isolation structures)). The additional slots 168 may include the first isolation structures 170 directly underlying and physically contacting the second isolation structures 172. The first isolation structures 170 are defined by the dielectric material 164 within lower portions of the additional slots 168, and the second isolation structures 172 are defined by the dielectric material 164 and the slot liner 158 within upper portions of the additional slots 168. Thus, the second isolation structures 172 individually comprise the dielectric material 164 and the slot liner 158 on opposing lateral sides of the dielectric material 164, without the slot liner 158 extending laterally adjacent to the first isolation structures 170. The slot liner 158 laterally intervenes between the second isolation structures 172 and the conductive contacts 152.

The first isolation structures 170 are individually defined by the dielectric material 164 of the additional slots 168 (also described herein as the first portion 166a of isolation structures 166), and the second isolation structures 172 are individually defined by the slot liner 158 and the dielectric material 164 of the additional slots 168 (also described herein as the second portion 166b and the third portion 166c of the isolation structures 166). The first isolation structures 170 may be substantially entirely free of the slot liner 158. Accordingly, the first isolation structures 170 may be formed of and include a single insulative material (e.g., the dielectric material 164), and the second isolation structures 172 may be formed of and include two or more materials (e.g., the slot liner 158 and the dielectric material 164). The upper pillars 126 (e.g., device structures) are located laterally adjacent to (e.g., at an elevational level of) the additional conductive structures 145 of the additional stack 105 and laterally adjacent to the first isolation structures 170. The conductive contacts 152 are located laterally adjacent to the upper insulative material 148 overlying the additional stack 105 and laterally adjacent to the second isolation structures 172.

As shown in FIG. 1G, the first isolation structures 170 of the additional slots 168 may be located between the upper pillars 126 that are substantially horizontally aligned in each of the X-direction and the Y-direction (e.g., that are concentric) with corresponding strings 160 of memory cells 162 directly underneath the upper pillars 126. Further, the second isolation structures 172 of the additional slots 168 may be located between the conductive contacts 152 that are substantially horizontally aligned in each of the X-direction and the Y-direction (e.g., that are concentric) with each of the upper pillars 126 directly underneath the conductive contacts 152. In other words, a central axis 180 of the pillars 110 of the strings 160 of the memory cells 162 is substantially horizontally aligned with a central axis 182 of the upper pillars 126, and a central axis 184 of the conductive contacts 152 is substantially horizontally aligned with the central axis 182 of the upper pillars 126 and, thus, with the central axis 180 of the pillars 110. Aligning the central axes 180, 182, 184 of the respective structures may facilitate a greater margin for electrical connection between the pillars 110, the upper pillars 126, and the conductive contacts 152 compared to conventional electronic devices.

In other embodiments, the additional upper pillars 126' (FIG. 1H) may be horizontally offset in at least one horizontal direction from the center of the underlying pillars 110, without being centered over a respective pillar 110, as shown for illustrative purposes in the fourth column from the left-hand side of the electronic device 100 of FIG. 1H. For example, the central axis 180 of at least some of the pillars 110 of the strings 160 of the memory cells 162 may be substantially horizontally aligned with the central axis 184 of the conductive contacts 152, without being aligned with the central axis 182 of the additional upper pillars 126'. Although FIG. 1H illustrates only three of the additional upper pillars 126' in a single column 109, the disclosure is not so limited. For example, the electronic device 100 may include additional columns 109 of the additional upper pillars 126' proximal the additional slots 168. In other words, the additional slots 168 may include the columns 109 of the additional upper pillars 126' on opposing sides thereof, while the columns 109 that are spaced from the additional slots 168 may include the upper pillars 126 that are concentric with the center of the underling pillars 110.

As shown in FIG. 1G, a first horizontal edge of the dielectric material 164 within the additional slots 168 is separated from a nearest horizontal edge of the upper pillars 126 by a dimension $D_8$ (e.g., a distance), and a second, opposing horizontal edge of the dielectric material 164 is separated from a nearest horizontal edge of the upper pillars 126 by a dimension $D_9$. In some embodiments, the dimension $D_8$ is substantially the same as (e.g., substantially equal to) the dimension $D_9$, such that the isolation structures 166 are substantially centered between the upper pillars 126. In other embodiments, the dimension $D_8$ differs from the dimension $D_9$, such as when the additional upper pillars 126' are horizontally offset from the pillars 110. By way of non-limiting example, one or more (e.g., each) of the dimension $D_8$ and the dimension $D_9$ may be within a range from about 15 nm to about 80 nm, such as from about 15 nm to about 25 nm, from about 25 nm to about 35 nm, from about 35 nm to about 45 nm, from about 45 nm to about 55 nm, from about 55 nm to about 65 nm, or from about 65 nm to about 80 nm. In some embodiments, each of the dimension $D_8$ and the dimension $D_9$ is within a range from about 40 nm to about 45 nm. However, the disclosure is not so limited and the dimension $D_8$ and the dimension $D_9$ may be different than those described.

Further, formation of the isolation structures 166 may facilitate formation of additional conductive structures (e.g., additional conductive material, conductive rails (not shown)) formed horizontally adjacent (e.g., horizontally on) at least some of the additional conductive structures 145 of the additional stack 105. In some circumstances, electrical resistance exhibited by the additional conductive structures 145 of the tiers 144 may be greater than desired. To lower the electrical resistance, the additional conductive structures may, optionally, be formed to extend (e.g., laterally extend) from the exposed surfaces of the additional conductive structures 145. Since the isolation structures 166 occupy regions proximal horizontal ends of the additional conductive structures 145 and are substantially centered between the upper pillars 126, the isolation structures 166 may be spaced from the additional conductive structures, such that the isolation structures 166 do not interfere (e.g., come into contact) with the additional conductive structures, if present.

As shown in FIG. 1H, the first portion 166a and the second portion 166b of the isolation structures 166 within the additional slots 168 (corresponding to the first isolation structures 170 and the second isolation structures 172) may exhibit the weave pattern wherein the first isolation structures 170 and portions of the second isolation structures 172 are not defined by a substantially straight line (e.g., extending in the Y-direction). Rather, the first isolation structures 170 may be configured to extend between neighboring columns 109 of the pillars 110 and the upper pillars 126 and may exhibit a non-linear shape to at least partially conform to the layout (e.g., the shape) of the pillars 110 and the upper pillars 126. For example, the first isolation structures 170 and portions of the second isolation structures 172 of the additional slots 168 may include arcuate surfaces including a crest region 165 (e.g., convex region) extending in a direction away from a horizontally neighboring (e.g., in the X-direction) pillar 110 and a respective upper pillar 126 and may include a corresponding valley region 167 (e.g., concave region) horizontally neighboring (e.g., in the X-direction) the crest region 165. Since the isolation structures 166 exhibit a relatively shallow weave pattern proximal the upper surfaces of the conductive contacts 152 and exhibit a progressively tighter weave pattern with increased distances from the upper surfaces of the conductive contacts 152, the first isolation structures 170 may exhibit a first weave pattern (e.g., a relatively tighter weave pattern) with relatively smaller distances between the crest region 165 and the valley region 167. The second isolation structures 172 may exhibit a second weave pattern (e.g., a relatively shallow weave pattern) with relatively larger distances (e.g., a greater wavelength) between the crest region 165 and the valley region 167 relative to respective distances of the first isolation structures 170. Accordingly the weave pattern of the second isolation structures 172 differs from the weave pattern of the first isolation structures 170.

In addition, the optional third portion 166c of the isolation structures 166 (shown in dashed lines) within the additional slots 168 (corresponding to uppermost portions of the second isolation structures 172) may exhibit a substantially rectangular cross-sectional shape with substantially linear portions 169 (e.g., substantially straight portions) extending in the Y-direction. Accordingly, the uppermost portions of the second isolation structures 172 may be configured to extend between neighboring columns 109 of the pillars 110 and the upper pillars 126 at an elevational level of the uppermost portions of the conductive contacts 152 (FIG. 1G) and may exhibit a substantially linear shape, with the second isolation structures 172 vertically overlying a portion of some of the pillars 110. Accordingly, the shape of the uppermost portions of the second isolation structures 172 differs from the non-linear shape of the first isolation structures 170 and lower portions of the second isolation structures 172. Since the additional slots 168 exhibit a tapered profile, a dimension (e.g., a width in the X-direction) of the second isolation structures 172 may be relatively larger than a dimension of the first isolation structures 170. In other words, the uppermost portions of the second isolation structures 172 may include a substantially rectangular cross-sectional shape, and a lateral extent of the second isolation structures 172 may be relatively greater than a lateral extent of the first isolation structures 170. Further, portions of the second isolation structures 172 may be within horizontal boundaries of the strings 160 of the memory cells 162, without being within horizontal boundaries of the upper pillars 126.

By forming the first isolation structures 170 to exhibit the weave pattern, the first isolation structures 170 may be formed to have a greater horizontal dimension without being located too close to or removing portions of the upper pillars 126. In addition, the weave pattern of the first isolation structures 170 and portions of the second isolation structures 172 may facilitate formation of the blocks 140 having a relatively smaller horizontal dimension between the slots 133 compared to conventional electronic devices. For example, additional slots of a conventional electronic device may be formed through some (e.g., a column of) upper pillars, reducing the total number of upper pillars that may be fit within a given horizontal dimension between neighboring slots. By forming the uppermost portions of the second isolation structures 172 to exhibit the substantially linear shape, the second isolation structures 172 may also be formed to have a greater horizontal dimension, without undesirably increasing the overall width (e.g., horizontal footprint) of the blocks 140 of the electronic device 100. By configuring and positioning the remaining portions of the conductive contacts 152 to extend beyond the horizontal boundary (e.g., lateral edge) of the upper pillars 126, the conductive contacts 152 may protect the upper pillars 126 from being removed during the material removal processes of the materials of the additional stack 105 during formation of the additional slots 168. Further, forming the additional slots 168 following formation of the conductive contacts 152 using one or more self-alignment processes, and without conducting additional patterning and etching processes, may reduce manufacturing costs and may provide increased process margins.

Referring again to FIG. 1G, interconnect structures 174 (e.g., digit line contacts, bit line contacts) may be formed over (e.g., directly on) and in electrical communication with the conductive material 150 of the conductive contacts 152. In addition, conductive lines 176 (e.g., digit lines, bit lines, data lines) may be formed over (e.g., directly on) and in electrical communication with the interconnect structures 174. The conductive lines 176 may also be formed over a dielectric material (e.g., an additional portion of the upper insulative material 148) overlying the barrier material 131, and the interconnect structures 174 may be formed within openings of the dielectric material. The interconnect structures 174 may be electrically coupled to the conductive lines 176 configured for selectively coupling to the strings 160 of the memory cells 162.

The lateral boundaries of the interconnect structures 174 may not extend beyond horizontal boundaries of the conductive contacts 152. Thus, a dimension (e.g., a width) of the interconnect structures 174 may be relatively smaller than a dimension of the conductive contacts 152 in at least one horizontal direction (e.g., the X-direction). In some embodiments, the lateral boundaries of the interconnect structures 174 are offset (e.g., positioned off-center or staggered) relative to the outer side surfaces of the conductive contacts 152 neighboring the additional slots 168. For example, some of the interconnect structures 174 may be offset in at least one horizontal direction (e.g., shifted left in the X-direction) and away from the additional slots 168, in combination with additional interconnect structures 174 offset in the horizontal direction (e.g., shifted right in the X-direction) and away from the additional slots 168 on an opposing side thereof, as shown in FIG. 1G. In some embodiments, at least one outer side surface of the interconnect structures 174 may be self-aligned with a respective outer side surface of the underlying conductive contacts 152. In other embodiments, the interconnect structures 174 may be substantially centered (not shown) over the conductive contacts 152.

The interconnect structures 174 may be formed of and include a conductive material, such as one or more of the materials described above with reference to the conductive structures 142. In some embodiments, the interconnect structures 174 comprise substantially the same material composition as the conductive structures 142 (e.g., tungsten). Each of the interconnect structures 174 may individually include a substantially homogeneous distribution or a substantially heterogeneous distribution of at least one conductive material. In some embodiments, each of the interconnect structures 174 is substantially homogeneous (e.g., includes a single material).

The conductive lines 176 may be formed of and include a conductive material. In some embodiments, the conductive lines 176 comprise tungsten. The conductive lines 176 may or may not include substantially the same material composition as one or more of the interconnect structures 174, the conductive contacts 152, and the conductive structures 142.

As shown in FIG. 1H, each of the pillars 110 and the upper pillars 126 may individually exhibit a substantially circular cross-sectional shape. In some embodiments, the interconnect structures 174 exhibit a substantially circular cross-sectional shape (not shown in the perspective of FIG. 1H). In other embodiments, the interconnect structures 174 exhibit a different cross-sectional shape than one or more (e.g., each) of the pillars 110, the upper pillars 126, and the conductive contacts 152. For example, the interconnect structures 174 may exhibit a lateral dimension (e.g., a length, a diameter) in a first horizontal direction that is larger than another lateral dimension (e.g., a width, a diameter) in a second horizontal direction. In other words, at least some of the interconnect structures 174 may exhibit a substantially elliptical (e.g., oblong, oval) cross-sectional shape. However, the disclosure is not so limited, and additional configurations may be contemplated. For example, one or more of the pillars 110, the upper pillars 126, the conductive contacts 152, and the interconnect structures 174 may individually exhibit a substantially rectangular cross-sectional shape (e.g., a substantially square cross-sectional shape).

As described above, the weave pattern of the first isolation structures 170 and portions of the second isolation structures 172 of the additional slots 168, in combination with the substantially linear shape of the uppermost portions of the second isolation structures 172 thereof may facilitate improved operation of the electronic device 100 according to embodiments of the disclosure, without undesirably increasing the overall width (e.g., horizontal footprint) of the blocks 140. In addition, the configuration of the second isolation structures 172 may facilitate formation of the additional slots 168 using the conductive contacts 152 in the self-alignment process of the electronic device 100, without conducting additional patterning and etching processes (e.g., without forming a weave pattern prior to forming the conductive contacts 152).

In addition, since the conductive contacts 152 of the electronic device 100 according to embodiments of the disclosure are formed to exhibit an outer dimension that is relatively larger than conventional conductive contacts of conventional electronic devices, the conductive contacts 152 may be formed to exhibit improved electrical properties compared to conventional conductive contacts. Further, the upper pillars 126 may be positioned and configured (e.g., centered over the pillars 110) to substantially reduce capacitance between horizontally neighboring upper pillars 126, resulting in improved electrical conductivity (and a lower electrical resistance) during use and operation of the electronic device 100 compared to conventional electronic devices.

Although FIGS. 1A through 1H have been described and illustrated as including memory cells 162 having a particular structure and configuration, the disclosure is not so limited. In some embodiments, the memory cells 162 may comprise so-called "MONOS" (metal-oxide-nitride-oxide-semiconductor) memory cells. In additional embodiments, the memory cells 162 comprise so-called "TANOS" (tantalum nitride-aluminum oxide-nitride-oxide-semiconductor) memory cells, or so-called "BETANOS" (band/barrier engineered TANOS) memory cells, each of which are subsets of MONOS memory cells. In other embodiments, the memory cells 162 comprise so-called "floating gate" memory cells including floating gates (e.g., metallic floating gates) as charge storage structures. The floating gates may horizontally intervene between central structures of the strings 160 and the conductive structures 142.

FIG. 2 illustrates a partial cutaway perspective view of a portion of an electronic device 200 (e.g., a microelectronic device, a memory device, such as a 3D NAND Flash memory device) including one or more electronic device structures 201 (e.g., a microelectronic device structure). The electronic device 200 may include structures substantially similar to the electronic device 100 previously described with reference to FIGS. 1A through 1H. As shown in FIG. 2, the electronic device structure 201 of the electronic device 200 may include a staircase structure 220 defining contact regions for connecting interconnect lines 206 to conductive structures 205 (e.g., corresponding to the conductive structures 142 (FIG. 1G)). The electronic device structure 201 may include vertical strings 207 (e.g., corresponding to the strings 160 (FIG. 1G)) of memory cells 203 (e.g., corresponding to the memory cells 162 (FIG. 1G)) that are coupled to each other in series. The vertical strings 207 may extend vertically (e.g., in the Z-direction) and orthogonally to conductive lines and the conductive structures 205, such as data lines 202 (e.g., corresponding to the conductive lines 176 (FIG. 1G)), a source tier 204 (e.g., corresponding to the source 103 (FIG. 1G)), the conductive structures 205, the interconnect lines 206, first select gates 208 (e.g., upper select gates, drain select gates (SGDs)), such as the additional conductive structures 145 (FIG. 1G) of the additional stack 105 (FIG. 1G), select lines 209, and a second select gate 210 (e.g., a lower select gate, a source select gate (SGS)). The first select gates 208 may be horizontally divided (e.g., in the Y-direction) into multiple blocks 232 (e.g., corresponding to the blocks 140 (FIG. 1H)) horizontally separated (e.g., in the Y-direction) from one another by slots 230 (e.g., corresponding to the dielectric material 146 (FIG. 1H) formed within the slot 133 (FIG. 1H) and the dielectric material 164 (FIG. 1H) of the additional slots 168 (FIG. 1H)). As described above, with reference to the electronic device 100, the size, shape, and orientation of the additional slots 168 relative to the upper pillars 126 (FIG. 1G) and the interconnect structures 174 (FIG. 1G) may facilitate formation of the first select gates 208 exhibiting a relatively improved properties.

Vertical conductive contacts 211 may electrically couple components to each other as shown. For example, the select lines 209 may be electrically coupled to the first select gates 208 and the interconnect lines 206 may be electrically coupled to the conductive structures 205. The electronic device 200 may also include a control unit 212 positioned under the memory array, which may include at least one of string driver circuitry, pass gates, circuitry for selecting gates, circuitry for selecting conductive lines (e.g., the data lines 202, the interconnect lines 206), circuitry for amplifying signals, and circuitry for sensing signals. The control unit 212 may be electrically coupled to the data lines 202, the source tier 204, the interconnect lines 206, the first select gates 208, and the second select gates 210, for example. In some embodiments, the control unit 212 includes CMOS (complementary metal-oxide-semiconductor) circuitry. In such embodiments, the control unit 212 may be characterized as having a "CMOS under Array" ("CuA") configuration.

The first select gates 208 may extend horizontally in a first direction (e.g., the X-direction) and may be coupled to respective first groups of vertical strings 207 of memory cells 203 at a first end (e.g., an upper end) of the vertical strings 207. The second select gate 210 may be formed in a substantially planar configuration and may be coupled to the vertical strings 207 at a second, opposite end (e.g., a lower end) of the vertical strings 207 of memory cells 203.

The data lines 202 (e.g., digit lines, bit lines) may extend horizontally in a second direction (e.g., in the Y-direction) that is at an angle (e.g., perpendicular) to the first direction in which the first select gates 208 extend. Individual data lines 202 may be coupled to individual groups of the vertical strings 207 extending the second direction (e.g., the Y-direction) at the first end (e.g., the upper end) of the vertical strings 207 of the individual groups. Additional individual groups of the vertical strings 207 extending the first direction (e.g., the X-direction) and coupled to individual first select gates 208 may share a particular vertical string 207 thereof with individual group of vertical strings 207 coupled to an individual data line 202. Thus, an individual vertical string 207 of memory cells 203 may be selected at an intersection of an individual first select gate 208 and an individual data line 202. Accordingly, the first select gates 208 may be used for selecting memory cells 203 of the vertical strings 207 of memory cells 203.

The conductive structures 205 (e.g., word line word lines, such as the conductive structures 142 (FIG. 1G)) may extend in respective horizontal planes. The conductive structures 205 may be stacked vertically, such that each conductive structure 205 is coupled to at least some of the vertical strings 207 of memory cells 203, and the vertical strings 207 of the memory cells 203 extend vertically through the stack structure including the conductive structures 205. The conductive structures 205 may be coupled to or may form control gates of the memory cells 203.

The first select gates 208 and the second select gates 210 may operate to select a vertical string 207 of the memory cells 203 interposed between data lines 202 and the source tier 204. Thus, an individual memory cell 203 may be selected and electrically coupled to a data line 202 by operation of (e.g., by selecting) the appropriate first select gate 208, second select gate 210, and conductive structure 205 that are coupled to the particular memory cell 203.

The staircase structure 220 may be configured to provide electrical connection between the interconnect lines 206 and the conductive structures 205 through the vertical conductive contacts 211. In other words, an individual conductive structure 205 may be selected via an interconnect line 206 in electrical communication with a respective vertical conductive contact 211 in electrical communication with the conductive structure 205. The data lines 202 may be electrically coupled to the vertical strings 207 through conductive contact structures 234 (e.g., corresponding to the interconnect structures 174 (FIG. 1G)).

Thus, in accordance with embodiments of the disclosure an electronic device comprises a stack comprising tiers of alternating conductive structures and insulative structures adjacent to a source, and strings of memory cells extending vertically through the stack. The strings of memory cells individually comprising a channel material extending vertically through the stack. The electronic device comprises an additional stack adjacent to the stack and comprising tiers of alternating additional conductive structures and additional insulative structures, pillars extending through the additional stack and adjacent to the strings of memory cells, conductive contacts adjacent to the pillars, and isolation structures laterally intervening between neighboring pillars. The isolation structures exhibit a weave pattern, and portions of the isolation structures are laterally adjacent to and physically contact the conductive contacts.

Thus, in accordance with additional embodiments of the disclosure, a method of forming an electronic device comprises forming a first stack comprising alternating first materials and second materials adjacent to a source, forming strings of memory cells comprising a channel material extending vertically through the first stack, forming a second stack comprising alternating additional first materials and additional second materials adjacent to the first stack, forming pillars extending through the second stack and adjacent to some of the strings of memory cells, forming conductive contacts adjacent to the pillars, and forming isolation structures between neighboring pillars. The isolation structures exhibit a weave pattern, and portions of the isolation structures are laterally adjacent to and physically contact the conductive contacts.

Thus, in accordance with additional embodiments of the disclosure, a memory device comprises strings of memory cells extending through a first stack comprising tiers of alternating first conductive structures and first insulative structures. The strings of memory cells comprise a channel material extending vertically through the first stack. The memory device comprises a second stack comprising tiers of alternating second conductive structures and second insulative structures adjacent to the first stack, device structures adjacent to the strings of memory cells and laterally adjacent to the second conductive structures of the second stack, and a first isolation structure laterally adjacent to the second conductive structures of the second stack. The first isolation structure exhibits a non-linear shape. The memory device comprises a second isolation structure vertically adjacent to the first isolation structure and located above an uppermost second conductive structure of the second stack. A shape of the second isolation structure differs from the non-linear shape of the first isolation structure.

Figure 3:
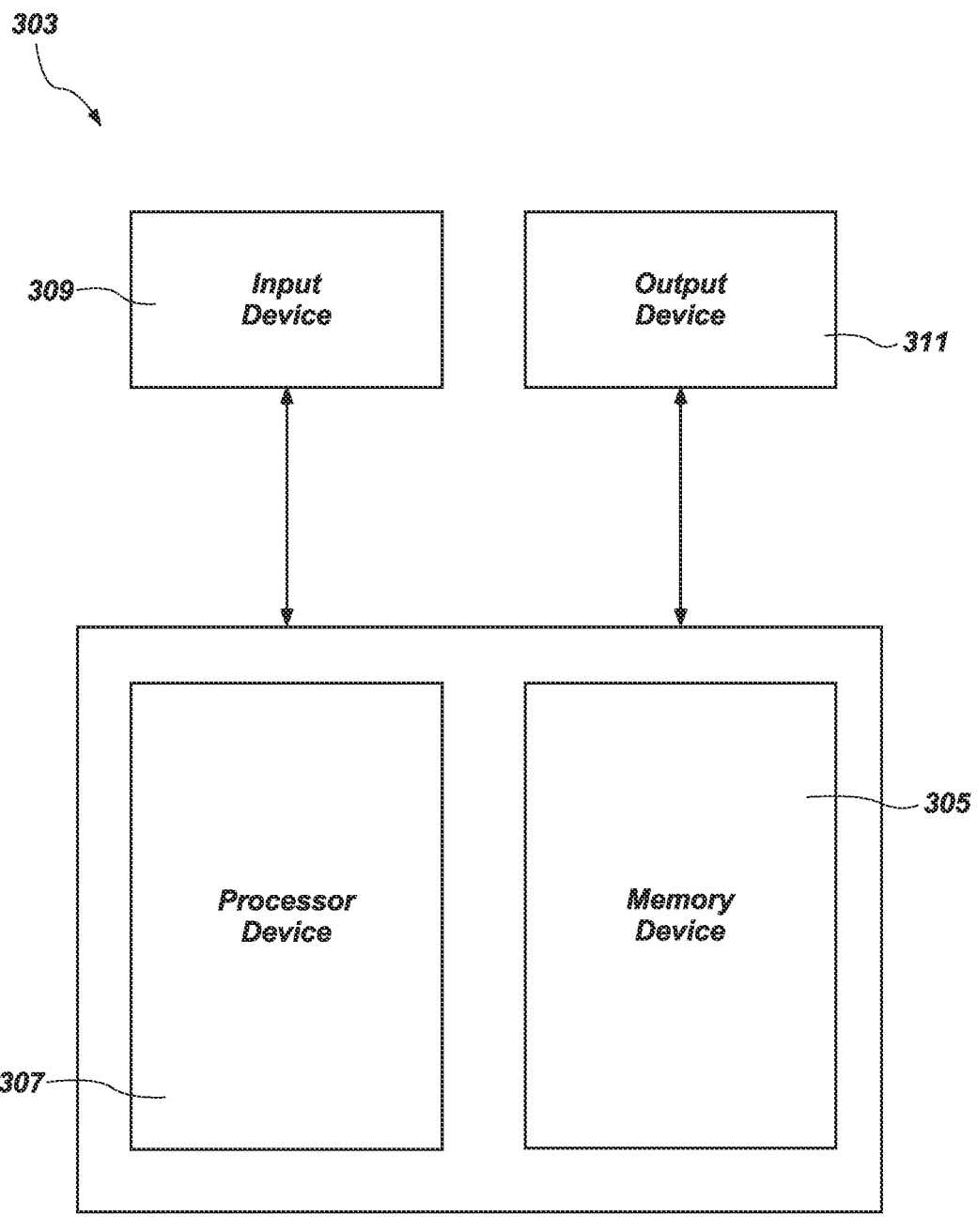
FIG. 3 is a block diagram of an electronic system, in accordance with embodiments of the disclosure.

Electronic devices (e.g., the electronic devices 100, 200) including the self-aligned weave pattern of the first isolation structures 170 and the second isolation structures 172 of the additional slots 168 using the conductive contacts 152 according to embodiments of the disclosure, may be used in embodiments of electronic systems of the disclosure. For example, FIG. 3 is a block diagram of an electronic system 303, in accordance with embodiments of the disclosure. The electronic system 303 may comprise, for example, a computer or computer hardware component, a server or other networking hardware component, a cellular telephone, a digital camera, a personal digital assistant (PDA), portable media (e.g., music) player, a Wi-Fi or cellular-enabled tablet such as, for example, an iPAD® or SURFACE® tablet, an electronic book, a navigation device, etc. The electronic system 303 includes at least one memory device 305. The memory device 305 may include, for example, an embodiment of an electronic device (e.g., the electronic devices 100, 200 previously described with reference to FIGS. 1A through 1H and FIG. 2) including the self-aligned weave pattern of the first isolation structures 170 and the second isolation structures 172 of the additional slots 168 using the conductive contacts 152.

The electronic system 303 may further include at least one electronic signal processor device 307 (often referred to as a "microprocessor"). The electronic signal processor device 307 may optionally include an embodiment of an electronic device (e.g., one or more of the electronic devices 100, 200 previously described with reference to FIGS. 1A through 1H and FIG. 2). The electronic system 303 may further include one or more input devices 309 for inputting information into the electronic system 303 by a user, such as, for example, a mouse or other pointing device, a keyboard, a touchpad, a button, or a control panel. The electronic system 303 may further include one or more output devices 311 for outputting information (e.g., visual or audio output) to a user such as, for example, a monitor, a display, a printer, an audio output jack, a speaker, etc. In some embodiments, the input device 309 and the output device 311 may comprise a single touchscreen device that can be used both to input information to the electronic system 303 and to output visual information to a user. The input device 309 and the output device 311 may communicate electrically with one or more of the memory device 305 and the electronic signal processor device 307.

Figure 4:
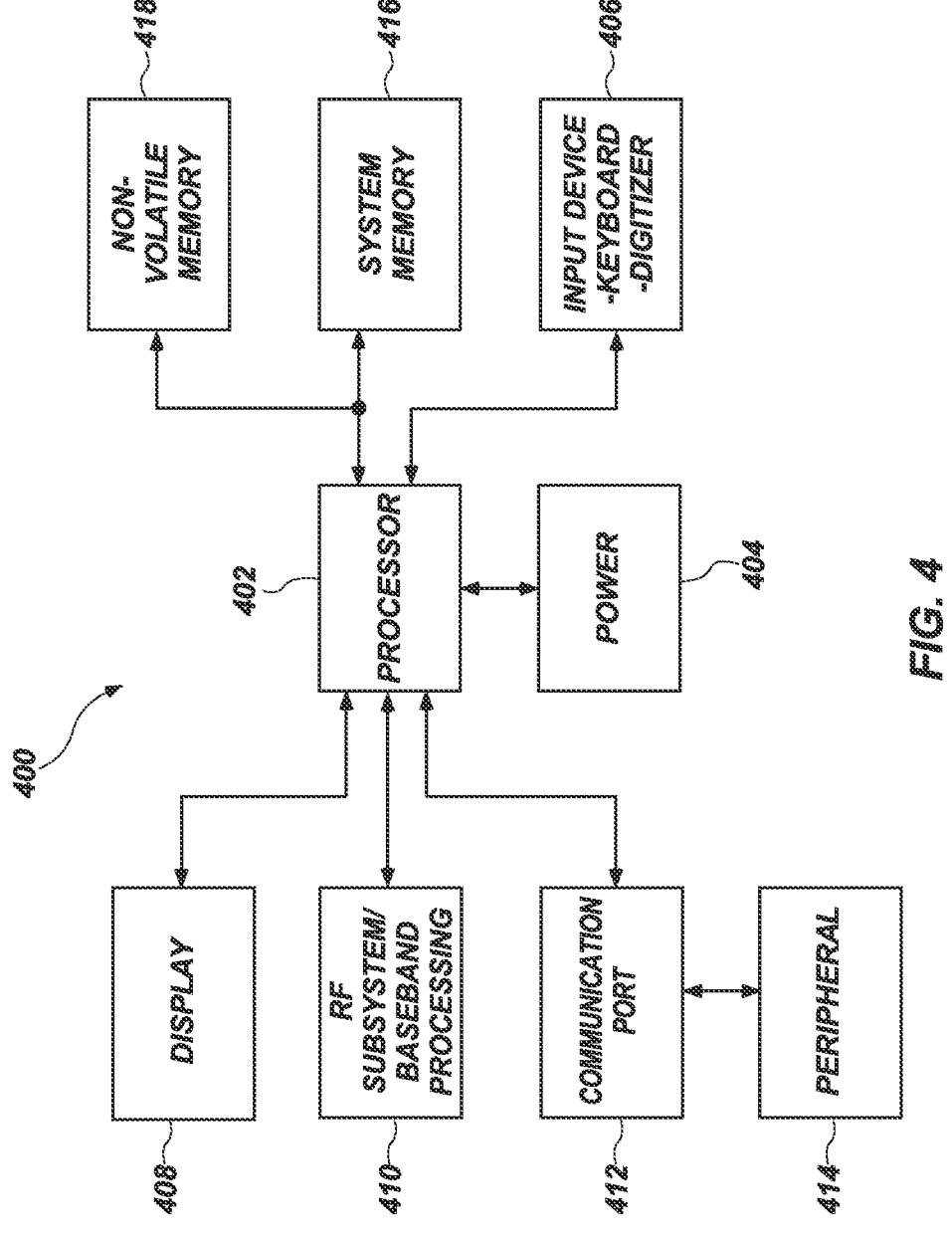
FIG. 4 is a block diagram of a processor-based system, in accordance with embodiments of the disclosure.

With reference to FIG. 4, depicted is a processor-based system 400. The processor-based system 400 may include various electronic devices (e.g., the electronic devices 100, 200) manufactured in accordance with embodiments of the present disclosure. The processor-based system 400 may be any of a variety of types such as a computer, pager, cellular phone, personal organizer, control circuit, or other electronic device. The processor-based system 400 may include one or more processors 402, such as a microprocessor, to control the processing of system functions and requests in the processor-based system 400. The processor 402 and other subcomponents of the processor-based system 400 may include electronic devices (e.g., the electronic devices 100, 200) manufactured in accordance with embodiments of the present disclosure.

The processor-based system 400 may include a power supply 404 in operable communication with the processor 402. For example, if the processor-based system 400 is a portable system, the power supply 404 may include one or more of a fuel cell, a power scavenging device, permanent batteries, replaceable batteries, and rechargeable batteries. The power supply 404 may also include an AC adapter; therefore, the processor-based system 400 may be plugged into a wall outlet, for example. The power supply 404 may also include a DC adapter such that the processor-based system 400 may be plugged into a vehicle cigarette lighter or a vehicle power port, for example.

Various other devices may be coupled to the processor 402 depending on the functions that the processor-based system 400 performs. For example, a user interface 406 may be coupled to the processor 402. The user interface 406 may include input devices such as buttons, switches, a keyboard, a light pen, a mouse, a digitizer and stylus, a touch screen, a voice recognition system, a microphone, or a combination thereof. A display 408 may also be coupled to the processor 402. The display 408 may include an LCD display, an SED display, a CRT display, a DLP display, a plasma display, an OLED display, an LED display, a three-dimensional projection, an audio display, or a combination thereof. Further-more, an RF sub-system/baseband processor 410 may also be coupled to the processor 402. The RF sub-system/baseband processor 410 may include an antenna that is coupled to an RF receiver and to an RF transmitter (not shown). A communication port 412, or more than one communication port 412, may also be coupled to the processor 402. The communication port 412 may be adapted to be coupled to one or more peripheral devices 414, such as a modem, a printer, a computer, a scanner, or a camera, or to a network, such as a local area network, remote area network, intranet, or the Internet, for example.

The processor 402 may control the processor-based system 400 by implementing software programs stored in the memory. The software programs may include an operating system, database software, drafting software, word processing software, media editing software, or media playing software, for example. The memory is operably coupled to the processor 402 to store and facilitate execution of various programs. For example, the processor 402 may be coupled to system memory 416, which may include one or more of spin torque transfer magnetic random access memory (STT-MRAM), magnetic random access memory (MRAM), dynamic random access memory (DRAM), static random access memory (SRAM), racetrack memory, and other known memory types. The system memory 416 may include volatile memory, non-volatile memory, or a combination thereof. The system memory 416 is typically large so that it can store dynamically loaded applications and data. In some embodiments, the system memory 416 may include semiconductor devices, such as the electronic devices (e.g., the electronic devices 100, 200) described above, or a combination thereof.

The processor 402 may also be coupled to non-volatile memory 418, which is not to suggest that system memory 416 is necessarily volatile. The non-volatile memory 418 may include one or more of STT-MRAM, MRAM, read-only memory (ROM) such as an EPROM, resistive read-only memory (RROM), and flash memory to be used in conjunction with the system memory 416. The size of the non-volatile memory 418 is typically selected to be just large enough to store any necessary operating system, application programs, and fixed data. Additionally, the non-volatile memory 418 may include a high-capacity memory such as disk drive memory, such as a hybrid-drive including resistive memory or other types of non-volatile solid-state memory, for example. The non-volatile memory 418 may include electronic devices, such as the electronic devices (e.g., the electronic devices 100, 200) described above, or a combination thereof.

Thus, in accordance with embodiments of the disclosure a system comprises a processor operably coupled to an input device and an output device, and electronic devices operably coupled to the processor. The electronic devices comprise vertically extending strings of memory cells coupled to access lines and a source, pillars overlying and coupled to the vertically extending strings of memory cells, conductive contacts overlying and coupled to the pillars, and filled slot structures horizontally neighboring the pillars and corresponding conductive contacts. Lower portions of the filled slot structures are self-aligned with the pillars, and upper portions of the filled slot structures are self-aligned with the conductive contacts.

The electronic devices and systems of the disclosure advantageously facilitate one or more of improved simplicity, greater packaging density, and increased miniaturization of components as compared to conventional devices and conventional systems. The methods of the disclosure facilitate the formation of devices (e.g., apparatuses, microelectronic devices, memory devices) and systems (e.g., electronic systems) having one or more of improved performance, reliability, and durability, lower costs, increased yield, increased miniaturization of components, improved pattern quality, and greater packaging density as compared to conventional devices (e.g., conventional apparatuses, conventional electronic devices, conventional memory devices) and conventional systems (e.g., conventional electronic systems).

While certain illustrative embodiments have been described in connection with the figures, those of ordinary skill in the art will recognize and appreciate that embodiments encompassed by the disclosure are not limited to those embodiments explicitly shown and described herein. Rather, many additions, deletions, and modifications to the embodiments described herein may be made without departing from the scope of embodiments encompassed by the disclosure, such as those hereinafter claimed, including legal equivalents. In addition, features from one disclosed embodiment may be combined with features of another disclosed embodiment while still being encompassed within the scope of the disclosure.

What is claimed is:

1. An electronic device, comprising:
   a stack comprising tiers of alternating conductive structures and insulative structures adjacent to a source;
   strings of memory cells extending vertically through the stack, the strings of memory cells individually comprising a channel material extending vertically through the stack;
   an additional stack adjacent to the stack and comprising tiers of alternating additional conductive structures and additional insulative structures;
   pillars extending through the additional stack and adjacent to the strings of memory cells;
   conductive contacts adjacent to the pillars; and
   isolation structures laterally intervening between neighboring pillars and laterally adjacent to and physically contacting the conductive contacts.

2. The electronic device of claim 1, wherein the isolation structures further comprise upper portions and lower portions, wherein the upper portions physically contact the conductive contacts, and the lower portions are spaced apart from the pillars.

3. The electronic device of claim 1, wherein the isolation structures comprise arcuate surfaces comprising a crest region extending in a direction away from a horizontally neighboring pillar and a corresponding valley region horizontally neighboring the crest region.

4. The electronic device of claim 1, wherein the isolation structures individually comprise a dielectric material and a liner material on opposing lateral sides of the dielectric material, the liner material comprising a carbon-containing nitride material or a conductive metal oxide laterally intervening between the conductive contacts and the dielectric material.

5. The electronic device of claim 1, wherein:
   at least some of the conductive contacts comprise a lower portion exhibiting a first width and an upper portion comprising a second, greater width; and
   a lateral extent of the isolation structures is relatively greater than a distance between horizontally neighboring conductive contacts.

6. The electronic device of claim 1, wherein portions of the isolation structures are in vertical alignment with portions of the conductive contacts.

7. The electronic device of claim 1, wherein the isolation structures further comprise first isolation structures and second isolation structures, wherein uppermost portions of the second isolation structures exhibit a substantially linear shape and the first isolation structures exhibit a non-linear shape.

8. The electronic device of claim 1, wherein a central axis of each of the pillars is substantially aligned with a central axis of a corresponding additional pillar of one of the strings of memory cells, and a central axis of each of the conductive contacts is substantially aligned with the central axis of a corresponding pillar.

9. The electronic device of claim 1, further comprising:
support structures laterally adjacent to the pillars, the support structures comprising a liner and a fill material substantially surrounded by the liner; and
additional conductive contacts adjacent to at least some of the support structures, a height of the additional conductive contacts substantially equal to a height of the conductive contacts.

10. A method of forming an electronic device, the method comprising:
forming a first stack comprising alternating first materials and second materials adjacent to a source;
forming strings of memory cells comprising a channel material extending vertically through the first stack;
forming a second stack comprising alternating additional first materials and additional second materials adjacent to the first stack;
forming pillars extending through the second stack and adjacent to some of the strings of memory cells;
forming conductive contacts adjacent to the pillars; and
forming isolation structures laterally intervening between neighboring pillars and laterally adjacent to and physically contacting the conductive contacts.

11. The method of claim 10, further comprising forming first slots between neighboring strings of memory cells and forming second slots between the neighboring pillars and corresponding neighboring conductive contacts, the isolation structures formed within the second slots following formation of the conductive contacts.

12. The method of claim 10, wherein forming the isolation structures comprises self-aligning the isolation structures with the conductive contacts, each of the conductive contacts substantially centered on a corresponding pillar.

13. The method of claim 10, wherein forming the isolation structures comprises selectively removing portions of one or more insulative materials and the conductive contacts in a single material removal act using a resist material comprising substantially linear openings.

14. The method of claim 10, wherein:
forming the second stack comprises forming alternating insulative structures and conductive structures arranged in tiers; and
forming the isolation structures comprises removing portions of the insulative structures and the conductive structures to form openings between the neighboring pillars and forming a dielectric material in the openings, upper surfaces of the isolation structures extending beyond an upper boundary of the second stack.

15. The method of claim 14, wherein forming the isolation structures comprises:
forming a slot liner within initial openings extending through an upper insulative material adjacent to the second stack; and forming the dielectric material within the openings extending from an upper surface of the upper insulative material and through a portion of the second stack.

16. The method of claim 10, wherein forming the isolation structures comprises removing portions of a conductive material of the conductive contacts and forming one or more non-conductive materials in locations previously occupied by the conductive material.

17. A memory device, comprising:
strings of memory cells extending through a first stack comprising tiers of alternating first conductive structures and first insulative structures, the strings of memory cells comprising a channel material extending vertically through the first stack;
a second stack comprising tiers of alternating second conductive structures and second insulative structures adjacent to the first stack;
device structures adjacent to the strings of memory cells and laterally adjacent to the second conductive structures of the second stack;
a first isolation structure laterally adjacent to the second conductive structures of the second stack, the first isolation structure exhibiting a non-linear shape that at least partially conforms to the layout of the strings of memory cells; and
a second isolation structure vertically adjacent to the first isolation structure and located above an uppermost second conductive structure of the second stack, a shape of the second isolation structure differing from the non-linear shape of the first isolation structure.

18. The memory device of claim 17, wherein an uppermost portion of the second isolation structure comprises a substantially rectangular cross-sectional shape, a lateral extent of the second isolation structure relatively greater than a lateral extent of the first isolation structure.

19. The memory device of claim 17, wherein the first isolation structure and the second isolation structure comprise a dielectric material within slot structures extending at least partially through the second stack.

20. The memory device of claim 17, wherein portions of the second isolation structure are within horizontal boundaries of the strings of memory cells, without being within horizontal boundaries of the device structures.

21. The memory device of claim 17, wherein the first isolation structure comprises a single dielectric material, and the second isolation structure comprises two or more materials.

22. The memory device of claim 17, wherein the second conductive structures comprise upper select gates separated from the first conductive structures by an interdeck region, lower portions of the device structures laterally adjacent to the upper select gates, and upper portions of the device structures located above an uppermost upper select gate.

23. A system, comprising:
a processor operably coupled to an input device and an output device; and
electronic devices operably coupled to the processor, the electronic devices comprising:
vertically extending strings of memory cells coupled to access lines and a source;
pillars overlying and coupled to the vertically extending strings of memory cells;
conductive contacts overlying and coupled to the pillars; and
filled slot structures horizontally neighboring the pillars and conductive contacts, lower portions of the filled slot structures self-aligned with the pillars, and upper portions of the filled slot structures self-aligned with the conductive contacts.

24. The system of claim 23, wherein upper surfaces of the filled slot structures are substantially coplanar with upper surfaces of the conductive contacts.

25. The system of claim 23, wherein:

the upper portions of the filled slot structures comprise a liner material laterally adjacent to the conductive contacts; and the lower portions of the filled slot structures are substantially free of the liner material.

26. The system of claim 23, wherein:

the pillars exhibit a tapered profile with an upper portion of individual pillars having a greater critical dimension than a lower portion thereof; and the conductive contacts exhibit a tapered profile with an upper portion of individual conductive contacts having a greater critical dimension than a lower portion thereof, the conductive contacts comprising a relatively greater taper than a taper of the pillars.

\* \* \* \* \*